(12) United States Patent
Boos et al.

(10) Patent No.: US 12,316,278 B2
(45) Date of Patent: May 27, 2025

(54) ELECTRONIC DEVICES WITH LOW PHASE NOISE FREQUENCY GENERATION

(71) Applicant: Apple Inc., Cupertino, CA (US)

(72) Inventors: Zdravko Boos, Munich (DE); Bertram R Gunzelmann, Koenigsbrunn (DE); Nedim Muharemovic, Nuremberg (DE); Ramin Khayatzadeh, Munich (DE); Tomas Sarmiento, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 145 days.

(21) Appl. No.: 18/186,125

(22) Filed: Mar. 17, 2023

(65) Prior Publication Data
US 2023/0353093 A1 Nov. 2, 2023

Related U.S. Application Data

(60) Provisional application No. 63/335,608, filed on Apr. 27, 2022.

(51) Int. Cl.
| | |
|---|---|
| *H03D 7/16* | (2006.01) |
| *H04B 10/2575* | (2013.01) |
| *H04B 10/61* | (2013.01) |
| *H04B 10/63* | (2013.01) |

(52) U.S. Cl.
CPC ....... *H03D 7/165* (2013.01); *H04B 10/25759* (2013.01); *H04B 10/6164* (2013.01); *H04B 10/63* (2013.01)

(58) Field of Classification Search
CPC . H03D 7/16; H03D 7/165; H03D 7/18; H04B 10/25; H04B 10/2575; H04B 10/25759; H04B 10/6164; H04B 10/63
See application file for complete search history.

(56) References Cited

U.S. PATENT DOCUMENTS 8,848,752 B2 * 9/2014 Prather ............... G02F 2/004
372/28
2013/0301664 A1 11/2013 Prather et al.

FOREIGN PATENT DOCUMENTS

CN 113285761 A 8/2021

OTHER PUBLICATIONS

U.S. Appl. No. 17/830,087, filed Jun. 1, 2022.
(Continued)

*Primary Examiner* — Long Nguyen
(74) *Attorney, Agent, or Firm* — Treyz Law Group, P.C.; Michael H. Lyons

(57) ABSTRACT

An electronic device may include clocking circuitry with primary and secondary lasers that generate first and second optical local oscillator (LO) signals. A phase-locked loop (PLL) may tune the secondary laser based to phase lock the first and second optical LO signals. A self-injection locking loop path may couple an output of the secondary laser to its input. The self-injection locking loop path may include a first mixer and a second mixer. The first mixer may generate a beat signal using the first and second optical LO signals. The second mixer may generate a self-injection locking signal based on the first optical LO signal and the beat signal. A delay line or optical resonator may iteratively self-inject the self-injection locking signal onto the secondary laser. This may serve to minimize phase noise and jitter of the optical LO signals.

20 Claims, 12 Drawing Sheets

(56) References Cited

OTHER PUBLICATIONS

Li Zhang et al., Oscillator Phase Noise Reduction Using Self-Injection Locked and Phase Locked Loop (SILPLL), 2014 IEEE International Frequency Control Symposium (FCS), 2014, pp. 1-4, IEEE, Taipei, Taiwan.

Guangcan Chen et al, Synchronized Narrow Linewidth Laser and High Quality Microwave Signal Generation using Optically Mutual-Injection-Locked DFB Lasers with Optoelectronic Feedback, in Conference on Lasers and Electro-Optics, 2018, pp. 1-2, Optica Publishing Group.

L. N. Langley et al., Packaged Semiconductor Laser Optical Phase-Locked Loop (OPLL) for Photonic Generation, Processing and Transmission of Microwave Signals, IEEE Transactions on Microwave Theory and Techniques, Jul. 1, 1999, pp. 1257-1264, vol. 47, No. 7, IEEE, New York, NY, United States.

Peter G. Goetz et al., InP-Based MMIC Components for an Optical Phase-Locked Loop, IEEE Transactions on Microwave Theory and Techniques, Jul. 1, 1999, pp. 1241-1250, vol. 47, No. 7, IEEE, New York, NY, United States.

\* cited by examiner

ELECTRONIC DEVICES WITH LOW PHASE NOISE FREQUENCY GENERATION

This application claims the benefit of U.S. Provisional Patent Application No. 63/335,608, filed Apr. 27, 2022, which is hereby incorporated by reference herein in its entirety.

FIELD

This disclosure relates generally to electronic devices and, more particularly, to electronic devices with wireless circuitry.

BACKGROUND

Electronic devices are often provided with wireless capabilities. An electronic device with wireless capabilities has wireless circuitry that includes one or more antennas. The wireless circuitry is used to perform communications using radio-frequency signals conveyed by the antennas.

As software applications on electronic devices become more data-intensive over time, demand has grown for electronic devices that support wireless communications at higher data rates. However, the maximum data rate supported by electronic devices is limited by the frequency of the radio-frequency signals. As communication frequencies increase, it can become difficult to provide low jitter and low phase noise clocking for the wireless circuitry.

SUMMARY

An electronic device may include wireless circuitry that conveys wireless signals at frequencies greater than 100 GHz. The wireless circuitry or other circuitry in the device may be clocked using clocking circuitry. The clocking circuitry may include a primary laser that emits a first optical local oscillator (LO) signal at a fixed first frequency and a secondary laser that emits a second optical LO signal at an adjustable second frequency. The wireless circuitry may, for example, convey the wireless signals using the first and second optical LO signals.

A phase-locked loop (PLL) path may couple an output of the secondary laser to an input of the secondary laser. A photodiode may be interposed on the PLL path. The photodiode may generate a photodiode signal based on the first and second optical LO signals. The clocking circuitry may include a reference oscillator that generates a reference oscillator signal. The PLL path may tune the secondary laser based on the reference oscillator signal and the photodiode signal to phase lock the second optical LO signal to the first optical LO signal.

A self-injection locking loop path may also couple an output of the secondary laser to an input of the secondary laser. The self-injection locking loop path may include a first mixer such as a photodiode and a second mixer such as an electro-optical modulator. The first mixer may generate a beat signal using the first and second optical LO signals. The second mixer may generate a self-injection locking signal based on the first optical LO signal and the beat signal. A delay line or an optical resonator coupled between the second mixer and the secondary laser may de-correlate phase noise of the secondary laser by filtering the self-injection locking signal and self-injecting the self-injection locking signal into the secondary laser. Alternatively, the delay line or optical resonator may be coupled between the output of the first mixer and the input of the second mixer. This process may iterate until phase noise of the secondary laser is sufficiently reduced. This may serve to minimize phase noise and jitter of the optical LO signals while also minimizing power consumption and chip area.

An aspect of the disclosure provides clocking circuitry. The clocking circuitry can include a first light source configured to generate a first optical LO signal at a first frequency. The clocking circuitry can include a second light source configured to generate a second optical LO signal at a second frequency different from the first frequency. The clocking circuitry can include a first mixer having a first input optically coupled to the first light source and having a second input optically coupled to the second light source. The clocking circuitry can include a second mixer having a first input optically coupled to the first light source, a second input communicably coupled to an output of the first mixer, and an output communicably coupled to the second light source.

An aspect of the disclosure provides clocking circuitry. The clocking circuitry can include a first laser configured to generate a first optical local oscillator (LO) signal. The clocking circuitry can include a second laser configured to generate a second optical LO signal. The clocking circuitry can include a phase-locked loop (PLL) path coupled around the second laser and configured to lock a phase of the second optical LO signal to a phase of the first optical LO signal. The clocking circuitry can include a self-injection locking loop path coupled around the second laser and configured to reduce a phase noise of the second optical LO signal by self-injecting the second laser.

An aspect of the disclosure provides a method of operating wireless circuitry to transmit wireless signals. The method can include emitting, at a first laser, a first optical local oscillator (LO) signal at a first frequency. The method can include emitting, at a second laser, a second optical LO signal at a second frequency that is different from the first frequency. The method can include producing, at a first photodiode illuminated by the first optical LO signal and the second optical LO signal, an antenna current on an antenna resonating element, the antenna current having a third frequency given by a difference between the first frequency and the second frequency. The method can include generating, at a second photodiode, a beat signal based on the first optical LO signal and the second optical LO signal, the beat signal having the third frequency. The method can include generating, at a mixer, a self-injection locking signal based on the beat signal and the first optical LO signal. The method can include self-injection locking the second laser based on the self-injection locking signal.

DETAILED DESCRIPTION

Figure 1:
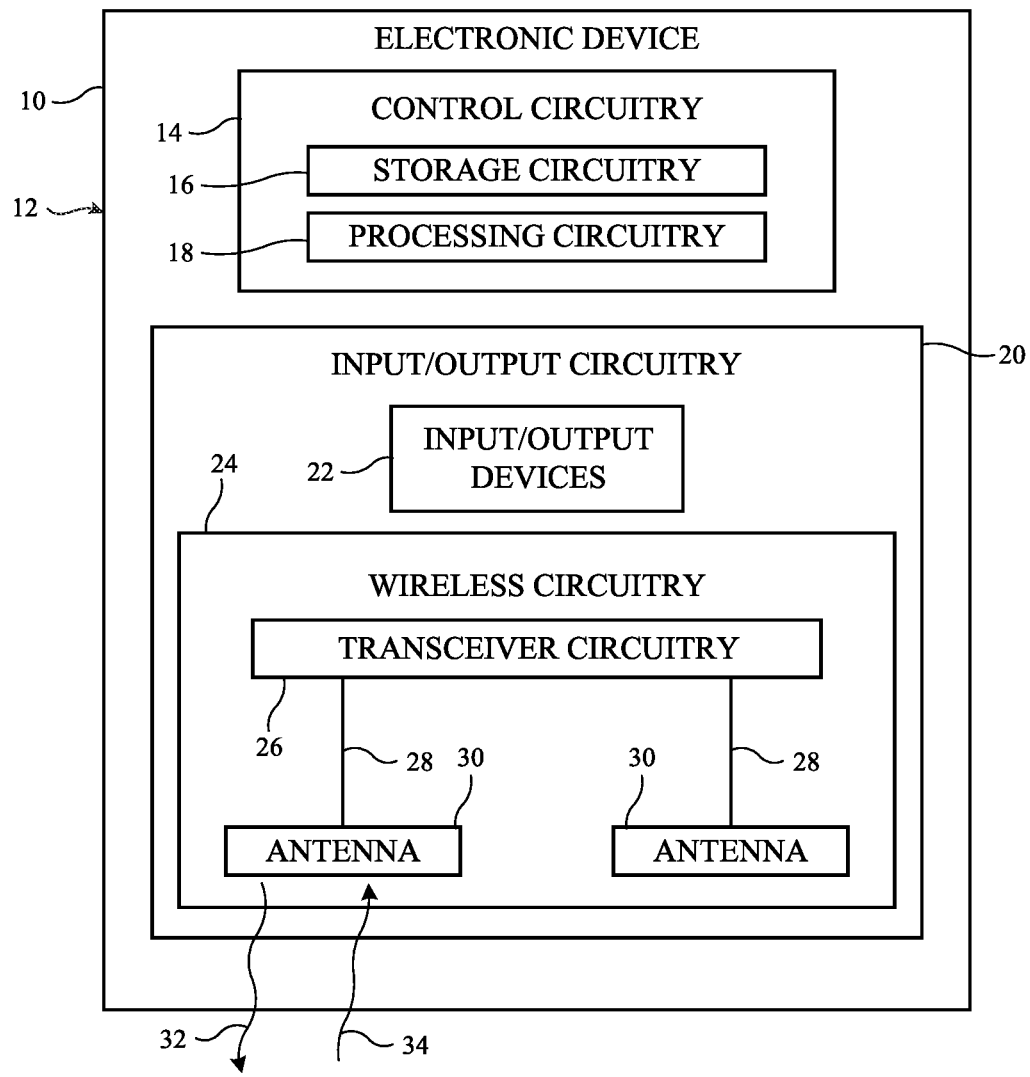
FIG. 1 is a block diagram of an illustrative electronic device having wireless circuitry with at least one antenna that conveys wireless signals at frequencies greater than about 100 GHz in accordance with some embodiments.

Electronic device 10 of FIG. 1 (sometimes referred to herein as electro-optical device 10) may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses, goggles, or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include one or more processors, microprocessors, microcontrollers, digital signal processors, host processors, baseband processor integrated circuits, application specific integrated circuits, central processing units (CPUs), graphics processing units (GPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 3GPP Fifth Generation (5G) New Radio (NR) protocols, Sixth Generation (6G) protocols, sub-THz protocols, THz protocols, etc.), antenna diversity protocols, satellite navigation system protocols (e.g., global positioning system (GPS) protocols, global navigation satellite system (GLONASS) protocols, etc.), antenna-based spatial ranging protocols, optical communications protocols, or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), temperature sensors, etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas 30.

Wireless circuitry 24 may also include transceiver circuitry 26. Transceiver circuitry 26 may include transmitter circuitry, receiver circuitry, modulator circuitry, demodulator circuitry (e.g., one or more modems), radio-frequency circuitry, one or more radios, intermediate frequency circuitry, optical transmitter circuitry, optical receiver circuitry, optical light sources, other optical components, baseband circuitry (e.g., one or more baseband processors), amplifier circuitry, clocking circuitry such as one or more local oscillators and/or phase-locked loops, memory, one or more registers, filter circuitry, switching circuitry, analog-to-digital converter (ADC) circuitry, digital-to-analog converter (DAC) circuitry, radio-frequency transmission lines, optical fibers, and/or any other circuitry for transmitting and/or receiving wireless signals using antennas 30. The components of transceiver circuitry 26 may be implemented on one integrated circuit, chip, system-on-chip (SOC), die, printed circuit board, substrate, or package, or the components of transceiver circuitry 26 may be distributed across two or more integrated circuits, chips, SOCs, printed circuit boards, substrates, and/or packages.

The example of FIG. 1 is merely illustrative. While control circuitry 14 is shown separately from wireless circuitry 24 in the example of FIG. 1 for the sake of clarity, wireless circuitry 24 may include processing circuitry (e.g., one or more processors) that forms a part of processing circuitry 18 and/or storage circuitry that forms a part of storage circuitry 16 of control circuitry 14 (e.g., portions of control circuitry 14 may be implemented on wireless circuitry 24). As an example, control circuitry 14 may include baseband circuitry (e.g., one or more baseband processors), digital control circuitry, analog control circuitry, and/or other control circuitry that forms part of wireless circuitry 24. The baseband circuitry may, for example, access a communication protocol stack on control circuitry 14 (e.g., storage circuitry 16) to: perform user plane functions at a PHY layer, MAC layer, RLC layer, PDCP layer, SDAP layer, and/or PDU layer, and/or to perform control plane functions at the PHY layer, MAC layer, RLC layer, PDCP layer, RRC, layer, and/or non-access stratum layer.

Transceiver circuitry 26 may be coupled to each antenna 30 in wireless circuitry 24 over a respective signal path 28. Each signal path 28 may include one or more radio-frequency transmission lines, waveguides, optical fibers, and/or any other desired lines/paths for conveying wireless signals between transceiver circuitry 26 and antenna 30. Antennas 30 may be formed using any desired antenna structures for conveying wireless signals. For example, antennas 30 may include antennas with resonating elements that are formed from dipole antenna structures, planar dipole antenna structures (e.g., bowtie antenna structures), slot antenna structures, loop antenna structures, patch antenna structures, inverted-F antenna structures, planar inverted-F antenna structures, helical antenna structures, monopole antennas, dipoles, hybrids of these designs, etc. Filter circuitry, switching circuitry, impedance matching circuitry, and/or other antenna tuning components may be adjusted to adjust the frequency response and wireless performance of antennas 30 over time.

If desired, two or more of antennas 30 may be integrated into a phased antenna array (sometimes referred to herein as a phased array antenna) in which each of the antennas conveys wireless signals with a respective phase and magnitude that is adjusted over time so the wireless signals constructively and destructively interfere to produce (form) a signal beam in a given pointing direction. The term "convey wireless signals" as used herein means the transmission and/or reception of the wireless signals (e.g., for performing unidirectional and/or bidirectional wireless communications with external wireless communications equipment). Antennas 30 may transmit the wireless signals by radiating the signals into free space (or to free space through intervening device structures such as a dielectric cover layer). Antennas 30 may additionally or alternatively receive the wireless signals from free space (e.g., through intervening devices structures such as a dielectric cover layer). The transmission and reception of wireless signals by antennas 30 each involve the excitation or resonance of antenna currents on an antenna resonating (radiating) element in the antenna by the wireless signals within the frequency band(s) of operation of the antenna.

Transceiver circuitry 26 may use antenna(s) 30 to transmit and/or receive wireless signals that convey wireless communications data between device 10 and external wireless communications equipment (e.g., one or more other devices such as device 10, a wireless access point or base station, etc.). The wireless communications data may be conveyed bidirectionally or unidirectionally. The wireless communications data may, for example, include data that has been encoded into corresponding data packets such as wireless data associated with a telephone call, streaming media content, internet browsing, wireless data associated with software applications running on device 10, email messages, etc.

Additionally or alternatively, wireless circuitry 24 may use antenna(s) 30 to perform wireless sensing operations. The sensing operations may allow device 10 to detect (e.g., sense or identify) the presence, location, orientation, and/or velocity (motion) of objects external to device 10. Control circuitry 14 may use the detected presence, location, orientation, and/or velocity of the external objects to perform any desired device operations. As examples, control circuitry 14 may use the detected presence, location, orientation, and/or velocity of the external objects to identify a corresponding user input for one or more software applications running on device 10 such as a gesture input performed by the user's hand(s) or other body parts or performed by an external stylus, gaming controller, head-mounted device, or other peripheral devices or accessories, to determine when one or more antennas 30 needs to be disabled or provided with a reduced maximum transmit power level (e.g., for satisfying regulatory limits on radio-frequency exposure), to determine how to steer (form) a radio-frequency signal beam produced by antennas 30 for wireless circuitry 24 (e.g., in scenarios where antennas 30 include a phased array of antennas 30), to map or model the environment around device 10 (e.g., to produce a software model of the room where device 10 is located for use by an augmented reality application, gaming application, map application, home design application, engineering application, etc.), to detect the presence of obstacles in the vicinity of (e.g., around) device 10 or in the direction of motion of the user of device 10, etc.

Wireless circuitry 24 may transmit and/or receive wireless signals within corresponding frequency bands of the electromagnetic spectrum (sometimes referred to herein as communications bands or simply as "bands"). The frequency bands handled by communications circuitry 26 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-100 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Over time, software applications on electronic devices such as device 10 have become more and more data intensive. Wireless circuitry on the electronic devices therefore needs to support data transfer at higher and higher data rates. In general, the data rates supported by the wireless circuitry are proportional to the frequency of the wireless signals conveyed by the wireless circuitry (e.g., higher frequencies can support higher data rates than lower frequencies). Wireless circuitry 24 may convey centimeter and millimeter wave signals to support relatively high data rates (e.g., because centimeter and millimeter wave signals are at relatively high frequencies between around 10 GHz and 100 GHz). However, the data rates supported by centimeter and millimeter wave signals may still be insufficient to meet all the data transfer needs of device 10. To support even higher data rates such as data rates up to 5-10 Gbps or higher, wireless circuitry 24 may convey wireless signals at frequencies greater than 100 GHz.

As shown in FIG. 1, wireless circuitry 24 may transmit wireless signals 32 and may receive wireless signals 34 at frequencies greater than around 100 GHz. Wireless signals 32 and 34 may sometimes be referred to herein as tremendously high frequency (THF) signals 32 and 34, sub-THz signals 32 and 34, THz signals 32 and 34, or sub-millimeter wave signals 32 and 34. THF signals 32 and 34 may be at sub-THz or THz frequencies such as frequencies between 100 GHz and 1 THz, between 100 GHz and 10 THz, between 100 GHz and 2 THz, between 200 GHz and 1 THz, between 300 GHz and 1 THz, between 300 GHz and 2 THz, between 300 GHz and 10 THz, between 100 GHz and 800 GHz, between 200 GHz and 1.5 THz, etc. (e.g., within a sub-THz, THz, THF, or sub-millimeter frequency band such as a 6G frequency band). The high data rates supported by these frequencies may be leveraged by device 10 to perform cellular telephone voice and/or data communications (e.g., while supporting spatial multiplexing to provide further data bandwidth), to perform spatial ranging operations such as radar operations to detect the presence, location, and/or velocity of objects external to device 10, to perform automotive sensing (e.g., with enhanced security), to perform health/body monitoring on a user of device 10 or another person, to perform gas or chemical detection, to form a high data rate wireless connection between device 10 and another device or peripheral device (e.g., to form a high data rate connection between a display driver on device 10 and a display that displays ultra-high resolution video), to form a remote radio head (e.g., a flexible high data rate connection), to form a THF chip-to-chip connection within device 10 that supports high data rates (e.g., where one antenna 30 on a first chip in device 10 transmits THF signals 32 to another antenna 30 on a second chip in device 10), and/or to perform any other desired high data rate operations.

Space is at a premium within electronic devices such as device 10. In some scenarios, different antennas 30 are used to transmit THF signals 32 than are used to receive THF signals 34. However, handling transmission of THF signals 32 and reception of THF signals 34 using different antennas 30 can consume an excessive amount of space and other resources within device 10 because two antennas 30 and signal paths 28 would be required to handle both transmission and reception. To minimize space and resource consumption within device 10, the same antenna 30 and signal path 28 may be used to both transmit THF signals 32 and to receive THF signals 34. If desired, multiple antennas 30 in wireless circuitry 24 may transmit THF signals 32 and may receive THF signals 34. The antennas may be integrated into a phased antenna array that transmits THF signals 32 and that receives THF signals 34 within a corresponding signal beam oriented in a selected beam pointing direction.

It can be challenging to incorporate components into wireless circuitry 24 that support wireless communications at these high frequencies. If desired, transceiver circuitry 26 and signal paths 28 may include optical components that convey optical signals to support the transmission of THF signals 32 and the reception of THF signals 34 in a space and resource-efficient manner. The optical signals may be used in transmitting THF signals 32 at THF frequencies and in receiving THF signals 34 at THF frequencies.

Figure 2:
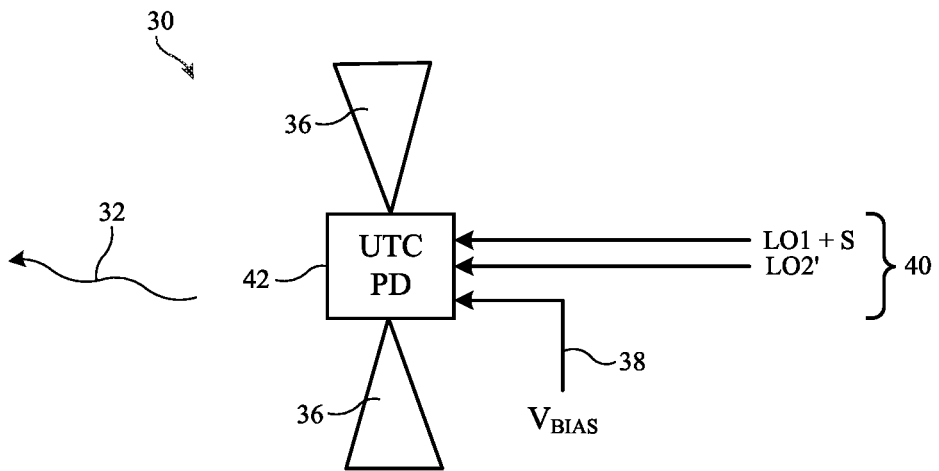
FIG. 2 is a top view of an illustrative antenna that transmits wireless signals at frequencies greater than about 100 GHz based on optical local oscillator (LO) signals in accordance with some embodiments.

FIG. 2 is a diagram of an illustrative antenna 30 that may be used to both transmit THF signals 32 and to receive THF signals 34 using optical signals. Antenna 30 may include one or more antenna radiating (resonating) elements such as radiating (resonating) element arms 36. In the example of FIG. 2, antenna 30 is a planar dipole antenna (sometimes referred to as a "bowtie" antenna) having two opposing radiating element arms 36 (e.g., bowtie arms or dipole arms). This is merely illustrative and, in general, antenna 30 may be any type of antenna having any desired antenna radiating element architecture.

As shown in FIG. 2, antenna 30 includes a photodiode (PD) 42 coupled between radiating element arms 36. Electronic devices that include antennas 30 with photodiodes 42 such as device 10 may sometimes also be referred to as electro-optical devices (e.g., electro-optical device 10). Photodiode 42 may be a programmable photodiode. An example in which photodiode 42 is a programmable uni-travelling-carrier photodiode (UTC PD) is described herein as an example. Photodiode 42 may therefore sometimes be referred to herein as UTC PD 42 or programmable UTC PD 42. This is merely illustrative and, in general, photodiode 42 may include any desired type of adjustable/programmable photodiode or component that converts electromagnetic energy (e.g., light or light energy) at optical frequencies (e.g., infrared, visible, and/or ultraviolet frequencies) to current at THF frequencies on radiating element arms 36 and/or vice versa. Each radiating element arm 36 may, for example, have a first edge at UTC PD 42 and a second edge opposite the first edge that is wider than the first edge (e.g., in implementations where antenna 30 is a bowtie antenna). Other radiating elements may be used if desired.

UTC PD 42 may have a bias terminal 38 that receives one or more control signals $V_{BIAS}$. Control signals $V_{BIAS}$ may include bias voltages provided at one or more voltage levels and/or other control signals for controlling the operation of UTC PD 42 such as impedance adjustment control signals for adjusting the output impedance of UTC PD 42. Control circuitry 14 (FIG. 1) may provide (e.g., apply, supply, assert, etc.) control signals $V_{BIAS}$ at different settings (e.g., values, magnitudes, etc.) to dynamically control (e.g., program or adjust) the operation of UTC PD 42 over time. For example, control signals $V_{BIAS}$ may be used to control whether antenna 30 transmits THF signals 32 or receives THF signals 34. When control signals $V_{BIAS}$ include a bias voltage asserted at a first level or magnitude, antenna 30 may be configured to transmit THF signals 32. When control signals $V_{BIAS}$ include a bias voltage asserted at a second level or magnitude, antenna 30 may be configured to receive THF signals 34. In the example of FIG. 2, control signals $V_{BIAS}$ include the bias voltage asserted at the first level to configure antenna 30 to transmit THF signals 32. If desired, control signals $V_{BIAS}$ may also be adjusted to control the waveform of the THF signals (e.g., as a squaring function that preserves the modulation of incident optical signals, a linear function, etc.), to perform gain control on the signals conveyed by antenna 30, and/or to adjust the output impedance of UTC PD 42.

As shown in FIG. 2, UTC PD 42 may be optically coupled to optical path 40. Optical path 40 may include one or more optical fibers or waveguides. UTC PD 42 may receive optical signals from transceiver circuitry 26 (FIG. 1) over optical path 40. The optical signals may include a first optical local oscillator (LO) signal LO1 and a second optical local oscillator signal LO2. Optical local oscillator signals LO1 and LO2 may be generated by light sources in transceiver circuitry 26 (FIG. 1). Optical local oscillator signals LO1 and LO2 may be at optical wavelengths (e.g., between 400 nm and 700 nm), ultra-violet wavelengths (e.g., near-ultra-violet or extreme ultraviolet wavelengths), and/or infrared wavelengths (e.g., near-infrared wavelengths, mid-infrared wavelengths, or far-infrared wavelengths). Optical local oscillator signal LO2 may be offset in wavelength from optical local oscillator signal LO1 by a wavelength offset X. Wavelength offset X may be equal to the wavelength of the THF signals conveyed by antenna 30 (e.g., between 100 GHz and 1 THz (1000 GHz), between 100 GHz and 2 THz, between 300 GHz and 800 GHz, between 300 GHz and 1 THz, between 300 and 400 GHz, etc.).

During signal transmission, wireless data (e.g., wireless data packets, symbols, frames, etc.) may be modulated onto optical local oscillator signal LO2 to produce modulated optical local oscillator signal LO2'. If desired, optical local oscillator signal LO1 may be provided with an optical phase shift S. Optical path 40 may illuminate UTC PD 42 with optical local oscillator signal LO1 (plus the optical phase shift S when applied) and modulated optical local oscillator signal LO2'. If desired, lenses or other optical components may be interposed between optical path 40 and UTC PD 42 to help focus the optical local oscillator signals onto UTC PD 42.

UTC PD 42 may convert optical local oscillator signal LO1 and modulated local oscillator signal LO2' (e.g., beats between the two optical local oscillator signals) into antenna currents that run along the perimeter of radiating element arms 36. The frequency of the antenna currents is equal to the frequency difference between local oscillator signal LO1 and modulated local oscillator signal LO2'. The antenna currents may radiate (transmit) THF signals 32 into free space. Control signal $V_{BIAS}$ may control UTC PD 42 to convert the optical local oscillator signals into antenna currents on radiating element arms 36 while preserving the modulation and thus the wireless data on modulated local oscillator signal LO2' (e.g., by applying a squaring function to the signals). THF signals 32 will thereby carry the modulated wireless data for reception and demodulation by external wireless communications equipment.

Figure 3:
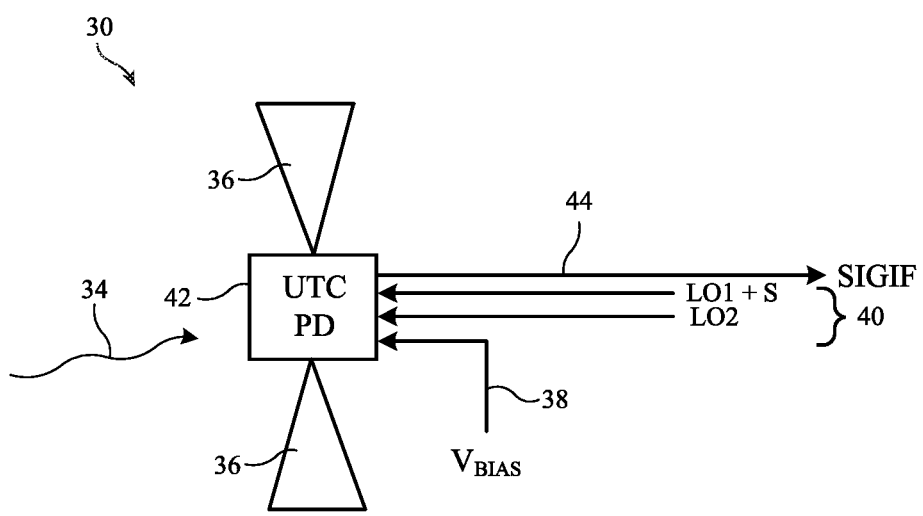
FIG. 3 is a top view showing how an illustrative antenna of the type shown in FIG. 2 may convert received wireless signals at frequencies greater than about 100 GHz into intermediate frequency signals based on optical LO signals in accordance with some embodiments.

FIG. 3 is a diagram showing how antenna 30 may receive THF signals 34 (e.g., after changing the setting of control signals $V_{BIAS}$ into a reception state from the transmission state of FIG. 2). As shown in FIG. 3, THF signals 34 may be incident upon antenna radiating element arms 36. The incident THF signals 34 may produce antenna currents that flow around the perimeter of radiating element arms 36. UTC PD 42 may use optical local oscillator signal LO1 (plus the optical phase shift S when applied), optical local oscillator signal LO2 (e.g., without modulation), and control signals $V_{BIAS}$ (e.g., a bias voltage asserted at the second level) to convert the received THF signals 34 into intermediate frequency signals SIGIF that are output onto intermediate frequency signal path 44.

The frequency of intermediate frequency signals SIGIF may be equal to the frequency of THF signals 34 minus the difference between the frequency of optical local oscillator signal LO1 and the frequency of optical local oscillator signal LO2. As an example, intermediate frequency signals SIGIF may be at lower frequencies than THF signals 32 and 34 such as centimeter or millimeter wave frequencies between 10 GHz and 100 GHz, between 30 GHz and 80 GHz, around 60 GHz, etc. If desired, transceiver circuitry 26 (FIG. 1) may change the frequency of optical local oscillator signal LO1 and/or optical local oscillator signal LO2 when switching from transmission to reception or vice versa. UTC PD 42 may preserve the data modulation of THF signals 34 in intermediate signals SIGIF. A receiver in transceiver circuitry 26 (FIG. 1) may demodulate intermediate frequency signals SIGIF (e.g., after further downconversion) to recover the wireless data from THF signals 34. In another example, wireless circuitry 24 may convert intermediate frequency signals SIGIF to the optical domain before recovering the wireless data. In yet another example, intermediate frequency signal path 44 may be omitted and UTC PD 42 may convert THF signals 34 into the optical domain for subsequent demodulation and data recovery (e.g., in a sideband of the optical signal).

Figure 4:
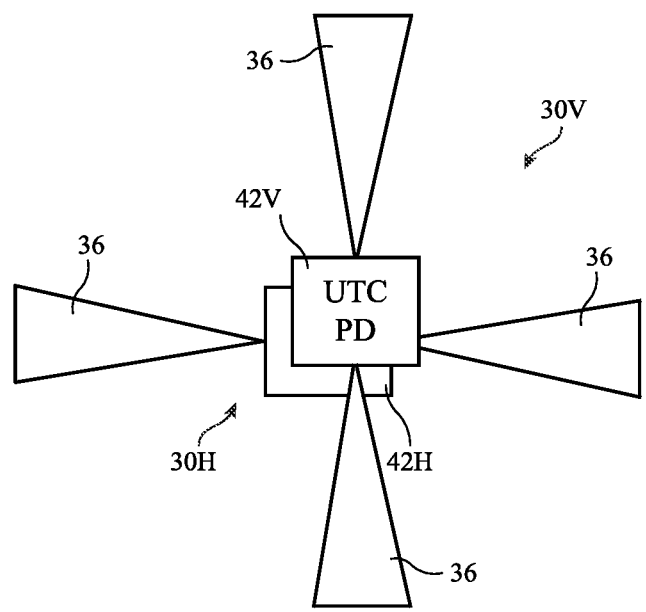
FIG. 4 is a top view showing how multiple antennas of the type shown in FIGS. 2 and 3 may be stacked to cover multiple polarizations in accordance with some embodiments.

The antenna 30 of FIGS. 2 and 3 may support transmission of THF signals 32 and reception of THF signals 34 with a given polarization (e.g., a linear polarization such as a vertical polarization). If desired, wireless circuitry 24 (FIG. 1) may include multiple antennas 30 for covering different polarizations. FIG. 4 is a diagram showing one example of how wireless circuitry 24 may include multiple antennas 30 for covering different polarizations.

As shown in FIG. 4, the wireless circuitry may include a first antenna 30 such as antenna 30V for covering a first polarization (e.g., a first linear polarization such as a vertical polarization) and may include a second antenna 30 such as antenna 30H for covering a second polarization different from or orthogonal to the first polarization (e.g., a second linear polarization such as a horizontal polarization). Antenna 30V may have a UTC PD 42 such as UTC PD 42V coupled between a corresponding pair of radiating element arms 36. Antenna 30H may have a UTC PD 42 such as UTC PD 42H coupled between a corresponding pair of radiating element arms 36 oriented non-parallel (e.g., orthogonal) to the radiating element arms 36 in antenna 30V. This may allow antennas 30V and 30H to transmit THF signals 32 with respective (orthogonal) polarizations and may allow antennas 30V and 30H to receive THF signals 32 with respective (orthogonal) polarizations.

To minimize space within device 10, antenna 30V may be vertically stacked over or under antenna 30H (e.g., where UTC PD 42V partially or completely overlaps UTC PD 42H). In this example, antennas 30V and 30H may both be formed on the same substrate such as a rigid or flexible printed circuit board. The substrate may include multiple stacked dielectric layers (e.g., layers of ceramic, epoxy, flexible printed circuit board material, rigid printed circuit board material, etc.). The radiating element arms 36 in antenna 30V may be formed on a separate layer of the substrate than the radiating element arms 36 in antenna 30H or the radiating element arms 36 in antenna 30V may be formed on the same layer of the substrate as the radiating element arms 36 in antenna 30H. UTC PD 42V may be formed on the same layer of the substrate as UTC PD 42H or UTC PD 42V may be formed on a separate layer of the substrate than UTC PD 42H. UTC PD 42V may be formed on the same layer of the substrate as the radiating element arms 36 in antenna 30V or may be formed on a separate layer of the substrate as the radiating element arms 36 in antenna 30V. UTC PD 42H may be formed on the same layer of the substrate as the radiating element arms 36 in antenna 30H or may be formed on a separate layer of the substrate as the radiating element arms 36 in antenna 30H.

Figure 5:
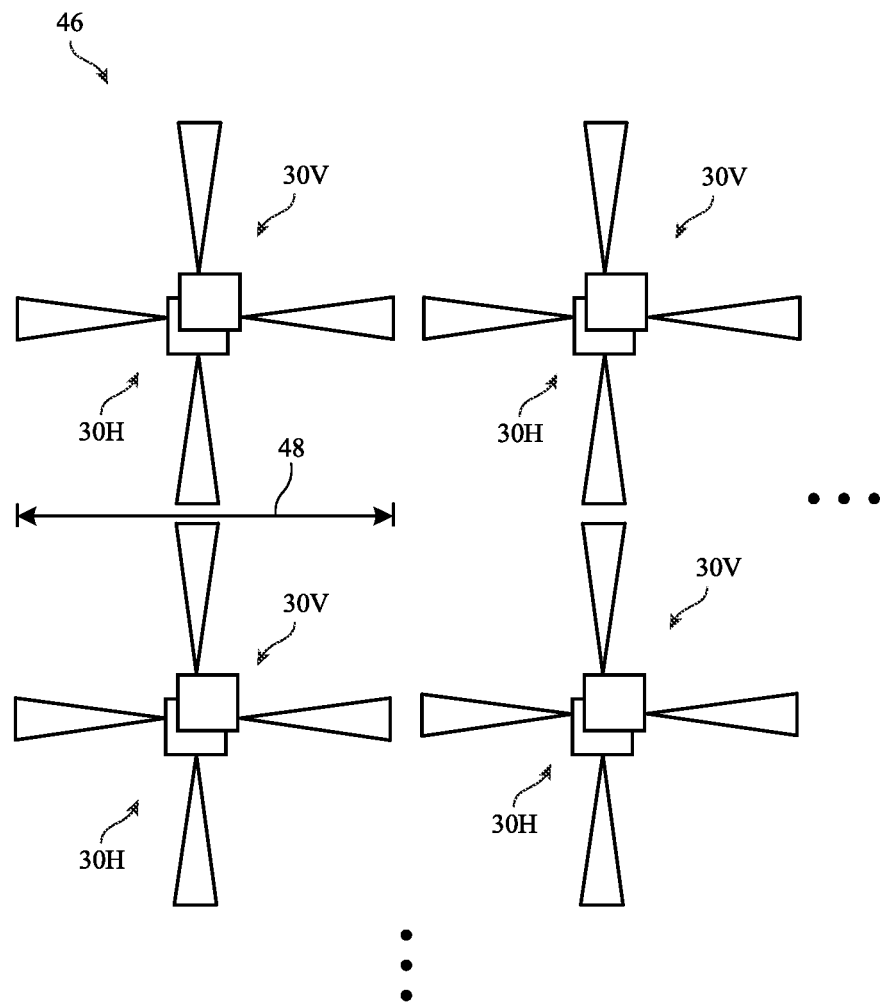
FIG. 5 is a top view showing how stacked antennas of the type shown in FIG. 4 may be integrated into a phased antenna array for conveying wireless signals at frequencies greater than about 100 GHz within a corresponding signal beam.

If desired, antennas 30 or antennas 30H and 30V of FIG. 4 may be integrated within a phased antenna array. FIG. 5 is a diagram showing one example of how antennas 30H and 30V may be integrated within a phased antenna array. As shown in FIG. 5, device 10 may include a phased antenna array 46 of stacked antennas 30H and 30V arranged in a rectangular grid of rows and columns. Each of the antennas in phased antenna array 46 may be formed on the same substrate. This is merely illustrative. In general, phased antenna array 46 (sometimes referred to as a phased array antenna) may include any desired number of antennas 30V and 30H (or non-stacked antennas 30) arranged in any desired pattern. Each of the antennas in phased antenna array 46 may be provided with a respective optical phase shift S (FIGS. 2 and 3) that configures the antennas to collectively transmit THF signals 32 and/or receive THF signals 34 that sum to form a signal beam of THF signals in a desired beam pointing direction. The beam pointing direction may be selected to point the signal beam towards external communications equipment, towards a desired external object, away from an external object, etc.

Phased antenna array 46 may occupy relatively little space within device 10. For example, each antenna 30V/30H may have a length 48 (e.g., as measured from the end of one radiating element arm to the opposing end of the opposite radiating element arm). Length 48 may be approximately equal to one-half the wavelength of THF signals 32 and 34. For example, length 48 may be as small as 0.5 mm or less. Each UTC-PD 42 in phased antenna array 46 may occupy a lateral area of 100 square microns or less. This may allow phased antenna array 46 to occupy very little area within device 10, thereby allowing the phased antenna array to be integrated within different portions of device 10 while still allowing other space for device components. The examples of FIGS. 2-5 are merely illustrative and, in general, each antenna may have any desired antenna radiating element architecture.

Figure 6:
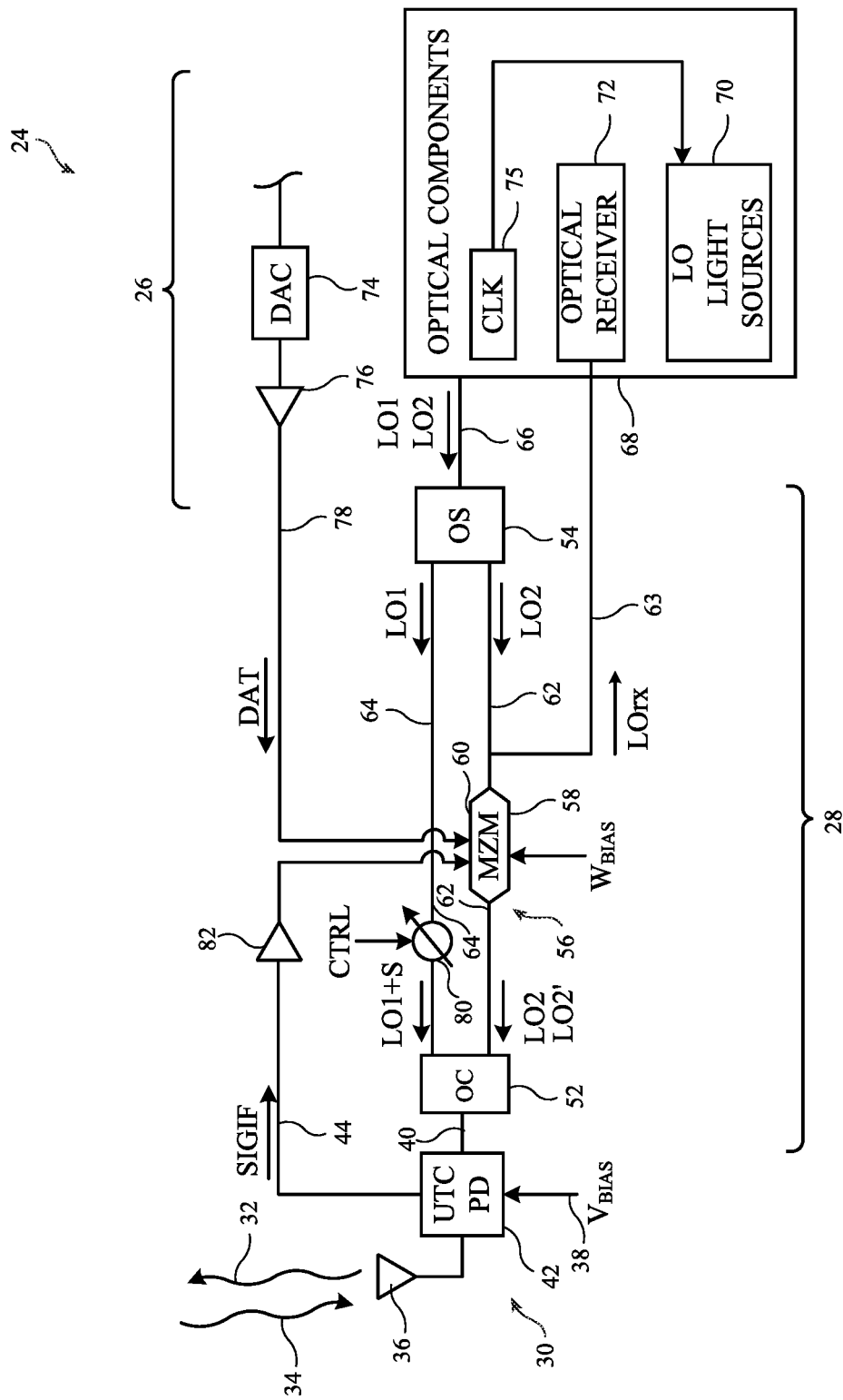
FIG. 6 is a circuit diagram of illustrative wireless circuitry having an antenna that transmits wireless signals at frequencies greater than about 100 GHz and that receives wireless signals at frequencies greater than about 100 GHz for conversion to intermediate frequencies and then to the optical domain in accordance with some embodiments.

FIG. 6 is a circuit diagram showing how a given antenna 30 and signal path 28 (FIG. 1) may be used to both transmit THF signals 32 and receive THF signals 34 based on optical local oscillator signals. In the example of FIG. 6, UTC PD 42 converts received THF signals 34 into intermediate frequency signals SIGIF that are then converted to the optical domain for recovering the wireless data from the received THF signals.

As shown in FIG. 6, wireless circuitry 24 may include transceiver circuitry 26 coupled to antenna 30 over signal path 28 (e.g., an optical signal path sometimes referred to herein as optical signal path 28). UTC PD 42 may be coupled between the radiating element arm(s) 36 of antenna 30 and signal path 28. Transceiver circuitry 26 may include optical components 68, amplifier circuitry such as power amplifier 76, and digital-to-analog converter (DAC) 74. Optical components 68 may include an optical receiver such as optical receiver 72 and optical local oscillator (LO) light sources (emitters) 70. LO light sources 70 may include two or more light sources (e.g., sources of electromagnetic energy, light, or light energy) such as laser light sources, laser diodes, optical phase locked loops, or other optical emitters that emit light (e.g., electromagnetic energy, light, or light energy that includes optical local oscillator signals LO1 and LO2) at respective wavelengths (e.g., visible, infrared, and/or ultraviolet wavelengths). If desired, LO light sources 70 may include a single light source and may include optical components for splitting the light emitted by the light source into different wavelengths. Signal path 28 may be coupled to optical components 68 over optical path 66. Optical path 66 may include one or more optical fibers and/or waveguides.

Signal path 28 may include an optical splitter such as optical splitter (OS) 54, optical paths such as optical path 64 and optical path 62, an optical combiner such as optical combiner (OC) 52, and optical path 40. Optical path 62 may be an optical fiber or waveguide. Optical path 64 may be an optical fiber or waveguide. Optical splitter 54 may have a first (e.g., input) port coupled to optical path 66, a second (e.g., output) port coupled to optical path 62, and a third (e.g., output) port coupled to optical path 64. Optical path 64 may couple optical splitter 54 to a first (e.g., input) port of optical combiner 52. Optical path 62 may couple optical splitter 54 to a second (e.g., input) port of optical combiner 52. Optical combiner 52 may have a third (e.g., output) port coupled to optical path 40.

An optical phase shifter such as optical phase shifter 80 may be (optically) interposed on or along optical path 64. An optical modulator such as optical modulator 56 may be (optically) interposed on or along optical path 62. Optical modulator 56 may be, for example, a Mach-Zehnder modulator (MZM) and may therefore sometimes be referred to herein as MZM 56. MZM 56 includes a first optical arm (branch) 60 and a second optical arm (branch) 58 interposed in parallel along optical path 62. Propagating optical local oscillator signal LO2 along arms 60 and 58 of MZM 56 may, in the presence of a voltage signal applied to one or both arms, allow different optical phase shifts to be imparted on each arm before recombining the signal at the output of the MZM (e.g., where optical phase modulations produced on the arms are converted to intensity modulations at the output of MZM 56). When the voltage applied to MZM 56 includes wireless data, MZM 56 may modulate the wireless data onto optical local oscillator signal LO2. If desired, the phase shifting performed at MZM 56 may be used to perform beam forming/steering in addition to or instead of optical phase shifter 80. MZM 56 may receive one or more bias voltages $W_{BIAS}$ (sometimes referred to herein as bias signals $W_{BIAS}$) applied to one or both of arms 58 and 60. Control circuitry 14 (FIG. 1) may provide bias voltage $W_{BIAS}$ with different magnitudes to place MZM 56 into different operating modes (e.g., operating modes that suppress optical carrier signals, operating modes that do not suppress optical carrier signals, etc.).

Intermediate frequency signal path 44 may couple UTC PD 42 to MZM 56 (e.g., arm 60). An amplifier such as low noise amplifier 82 may be interposed on intermediate frequency signal path 44. Intermediate frequency signal path 44 may be used to pass intermediate frequency signals SIGIF from UTC PD 42 to MZM 56. DAC 74 may have an input coupled to up-conversion circuitry, modulator circuitry, and/or baseband circuitry in a transmitter of transceiver circuitry 26. DAC 74 may receive digital data to transmit over antenna 30 and may convert the digital data to the analog domain (e.g., as data DAT). DAC 74 may have an output coupled to transmit data path 78. Transmit data path 78 may couple DAC 74 to MZM 56 (e.g., arm 60). Each of the components along signal path 28 may allow the same antenna 30 to both transmit THF signals 32 and receive THF signals 34 (e.g., using the same components along signal path 28), thereby minimizing space and resource consumption within device 10.

LO light sources 70 may produce (emit) optical local oscillator signals LO1 and LO2 (e.g., at different wavelengths that are separated by the wavelength of THF signals 32/34). Optical components 68 may include lenses, waveguides, optical couplers, optical fibers, and/or other optical components that direct the emitted optical local oscillator signals LO1 and LO2 towards optical splitter 54 via optical path 66. Optical splitter 54 may split the optical signals on optical path 66 (e.g., by wavelength) to output optical local oscillator signal LO1 onto optical path 64 while outputting optical local oscillator signal LO2 onto optical path 62.

Control circuitry 14 (FIG. 1) may provide phase control signals CTRL to optical phase shifter 80. Phase control signals CTRL may control optical phase shifter 80 to apply optical phase shift S to the optical local oscillator signal LO1 on optical path 64. Phase shift S may be selected to steer a signal beam of THF signals 32/34 in a desired pointing direction. Optical phase shifter 80 may pass the phase-shifted optical local oscillator signal LO1 (denoted as LO1+S) to optical combiner 52. Signal beam steering is performed in the optical domain (e.g., using optical phase shifter 80) rather than in the THF domain because there are no satisfactory phase shifting circuit components that operate at frequencies as high as the frequencies of THF signals 32 and 34. Optical combiner 52 may receive optical local oscillator signal LO2 over optical path 62. Optical combiner 52 may combine optical local oscillator signals LO1 and LO2 onto optical path 40, which directs the optical local oscillator signals onto UTC PD 42 for use during signal transmission or reception.

During transmission of THF signals 32, DAC 74 may receive digital wireless data (e.g., data packets, frames, symbols, etc.) for transmission over THF signals 32. DAC 74 may convert the digital wireless data to the analog domain and may output (transmit) the data onto transmit data path 78 as data DAT (e.g., for transmission via antenna 30). Power amplifier 76 may amplify data DAT. Transmit data path 78 may pass data DAT to MZM 56 (e.g., arm 60). MZM 56 may modulate data DAT onto optical local oscillator signal LO2 to produce modulated optical local oscillator signal LO2' (e.g., an optical local oscillator signal at the frequency/wavelength of optical local oscillator signal LO2 but that is modulated to include the data identified by data DAT). Optical combiner 52 may combine optical local oscillator signal LO1 with modulated optical local oscillator signal LO2' at optical path 40.

Optical path 40 may illuminate UTC PD 42 with (using) optical local oscillator signal LO1 (e.g., with the phase shift S applied by optical phase shifter 80) and modulated optical local oscillator signal LO2'. Control circuitry 14 (FIG. 1) may apply a control signal $V_{BIAS}$ to UTC PD 42 that configures antenna 30 for the transmission of THF signals 32. UTC PD 42 may convert optical local oscillator signal LO1 and modulated optical local oscillator signal LO2' into antenna currents on radiating element arm(s) 36 at the frequency of THF signals 32 (e.g., while programmed for transmission using control signal $V_{BIAS}$). The antenna currents on radiating element arm(s) 36 may radiate THF signals 32. The frequency of THF signals 32 is given by the difference in frequency between optical local oscillator signal LO1 and modulated optical local oscillator signal LO2'. Control signals $V_{BIAS}$ may control UTC PD 42 to preserve the modulation from modulated optical local oscillator signal LO2' in the radiated THF signals 32. External equipment that receives THF signals 32 will thereby be able to extract data DAT from the THF signals 32 transmitted by antenna 30.

During reception of THF signals 34, MZM 56 does not modulate any data onto optical local oscillator signal LO2. Optical path 40 therefore illuminates UTC PD 42 with optical local oscillator signal LO1 (e.g., with phase shift S) and optical local oscillator signal LO2. Control circuitry 14 (FIG. 1) may apply a control signal $V_{BIAS}$ (e.g., a bias voltage) to UTC PD 42 that configures antenna 30 for the receipt of THF signals 32. UTC PD 42 may use optical local oscillator signals LO1 and LO2 to convert the received THF signals 34 into intermediate frequency signals SIGIF output onto intermediate frequency signal path 44 (e.g., while programmed for reception using bias voltage $V_{BIAS}$). Intermediate frequency signals SIGIF may include the modulated data from the received THF signals 34. Low noise amplifier 82 may amplify intermediate frequency signals SIGIF, which are then provided to MZM 56 (e.g., arm 60). MZM 56 may convert intermediate frequency signals SIGIF to the optical domain as optical signals LOrx (e.g., by modulating the data in intermediate frequency signals SIGIF onto one of the optical local oscillator signals) and may pass the optical signals to optical receiver 72 in optical components 68, as shown by arrow 63 (e.g., via optical paths 62 and 66 or other optical paths). Control circuitry 14 (FIG. 1) may use optical receiver 72 to convert optical signals LOrx to other formats and to recover (demodulate) the data carried by THF signals 34 from the optical signals. In this way, the same antenna 30 and signal path 28 may be used for both the transmission and reception of THF signals while also performing beam steering operations.

The example of FIG. 6 in which intermediate frequency signals SIGIF are converted to the optical domain is merely illustrative. If desired, transceiver circuitry 26 may receive and demodulate intermediate frequency signals SIGIF without first passing the signals to the optical domain. For example, transceiver circuitry 26 may include an analog-to-digital converter (ADC), intermediate frequency signal path 44 may be coupled to an input of the ADC rather than to MZM 56, and the ADC may convert intermediate frequency signals SIGIF to the digital domain. As another example, intermediate frequency signal path 44 may be omitted and control signals $V_{BIAS}$ may control UTC PD 42 to directly sample THF signals 34 with optical local oscillator signals LO1 and LO2 to the optical domain. As an example, UTC PD 42 may use the received THF signals 34 and control signals $V_{BIAS}$ to produce an optical signal on optical path 40. The optical signal may have an optical carrier with sidebands that are separated from the optical carrier by a fixed frequency offset (e.g., 30-100 GHz, 60 GHz, 50-70 GHz, 10-100 GHz, etc.). The sidebands may be used to carry the modulated data from the received THF signals 34. Signal path 28 may direct (propagate) the optical signal produced by UTC PD 42 to optical receiver 72 in optical components 68 (e.g., via optical paths 40, 64, 62, 66, 63, and/or other optical paths). Control circuitry 14 (FIG. 1) may use optical receiver 72 to convert the optical signal to other formats and to recover (demodulate) the data carried by THF signals 34 from the optical signal (e.g., from the sidebands of the optical signal).

If desired, optical components 68 may include clocking circuitry such as clocking (CLK) circuitry 75 (sometimes referred to herein as clock circuitry 75 or clock generation circuitry 75). Clocking circuitry 75 may include one or more electro-optical phase-locked loops (OPLLs), frequency locked loops (FLLs), and self-injection locked (locking) loops. As shown in FIG. 6, clocking circuitry 75 may be used to control and clock LO light sources 70 and/or to clock any other desired hardware in device 10 (e.g., clocking circuitry 75 need not be located in transceiver 26 and may, in general, be located elsewhere in device 10). LO light sources 70 may, for example, generate optical LO signals that are phase-locked, self-injection locked, and optionally frequency-locked with respect to each other using clocking circuitry 75.

Figure 7:
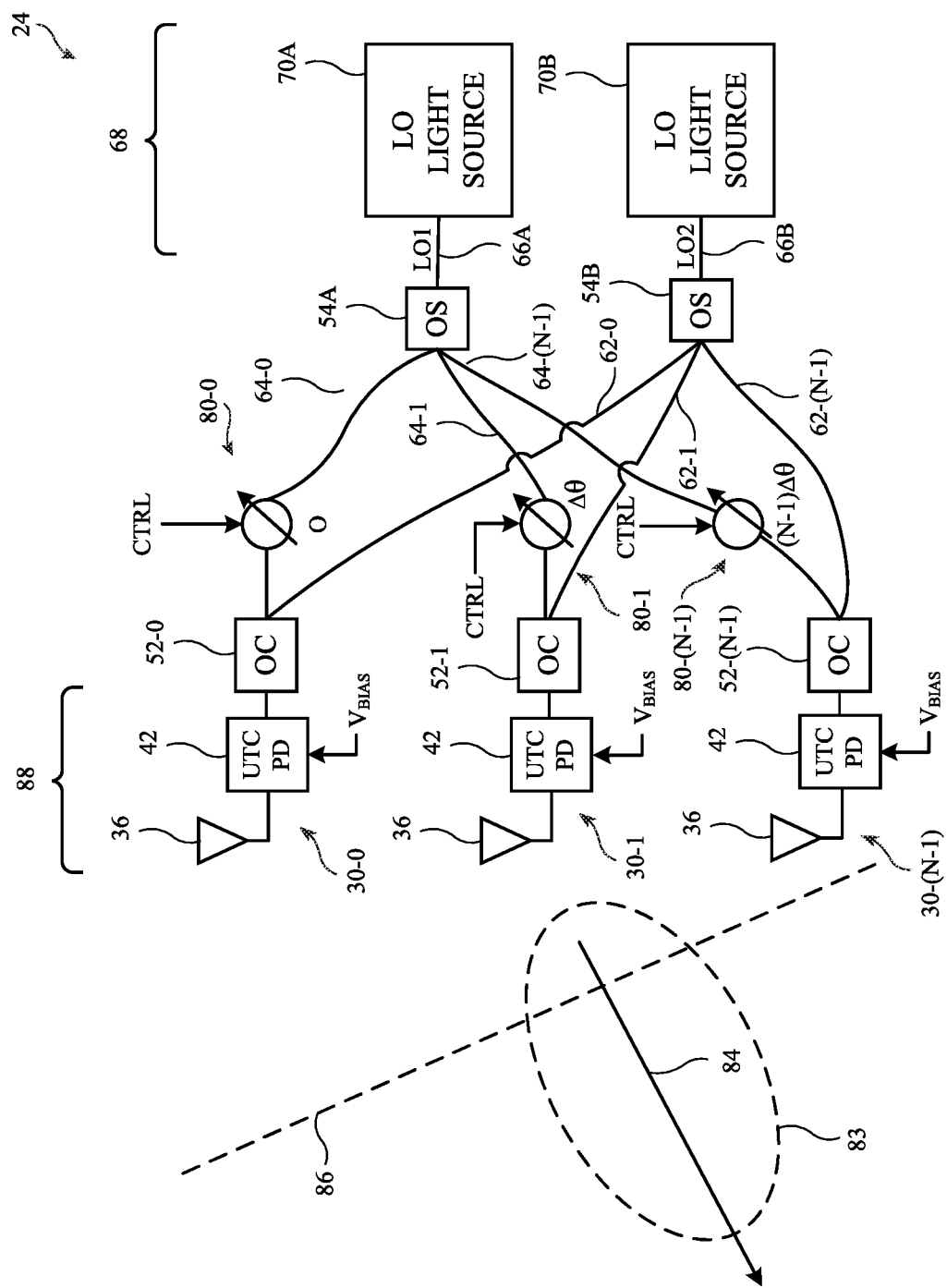
FIG. 7 is a circuit diagram of an illustrative phased antenna array that conveys wireless signals at frequencies greater than about 100 GHz within a corresponding signal beam in accordance with some embodiments.

FIG. 7 is a circuit diagram showing one example of how multiple antennas 30 may be integrated into a phased antenna array 88 that conveys THF signals over a corresponding signal beam. In the example of FIG. 7, MZMs 56, intermediate frequency signal paths 44, data paths 78, and optical receiver 72 of FIG. 6 have been omitted for the sake of clarity. Each of the antennas in phased antenna array 88 may alternatively sample received THF signals directly into the optical domain or may pass intermediate frequency signals SIGIF to ADCs in transceiver circuitry 26.

As shown in FIG. 7, phased antenna array 88 includes N antennas 30 such as a first antenna 30-0, a second antenna 30-1, and an Nth antenna 30-(N−1). Each of the antennas 30 in phased antenna array 88 may be coupled to optical components 68 via a respective optical signal path (e.g., optical signal path 28 of FIG. 6). Each of the N signal paths may include a respective optical combiner 52 coupled to the UTC PD 42 of the corresponding antenna 30 (e.g., the UTC PD 42 in antenna 30-0 may be coupled to optical combiner 52-0, the UTC PD 42 in antenna 30-1 may be coupled to optical combiner 52-1, the UTC PD 42 in antenna 30-(N−1) may be coupled to optical combiner 52-(N−1), etc.). Each of the N signal paths may also include a respective optical path 62 and a respective optical path 64 coupled to the corresponding optical combiner 52 (e.g., optical paths 64-0 and 62-0 may be coupled to optical combiner 52-0, optical paths 64-1 and 62-1 may be coupled to optical combiner 52-1, optical paths 64-(N−1) and 62-(N−1) may be coupled to optical combiner 52-(N−1), etc.).

Optical components 68 may include LO light sources 70 such as a first LO light source 70A and a second LO light source 70B. The optical signal paths for each of the antennas 30 in phased antenna array 88 may share one or more optical splitters 54 such as a first optical splitter 54A and a second optical splitter 54B. LO light source 70A may generate (e.g., produce, emit, transmit, etc.) first optical local oscillator signal LO1 and may provide first optical local oscillator signal LO1 to optical splitter 54A via optical path 66A. Optical splitter 54A may distribute first optical local oscillator signal LO1 to each of the UTC PDs 42 in phased antenna array 88 over optical paths 64 (e.g., optical paths 64-0, 64-1, 64-(N−1), etc.). Similarly, LO light source 70B may generate (e.g., produce, emit, transmit, etc.) second optical local oscillator signal LO2 and may provide second optical local oscillator signal LO2 to optical splitter 54B via optical path 66B. Optical splitter 54B may distribute second optical local oscillator signal LO2 to each of the UTC PDs 42 in phased antenna array 88 over optical paths 62 (e.g., optical paths 62-0, 62-1, 62-(N−1), etc.).

A respective optical phase shifter 80 may be interposed along (on) each optical path 64 (e.g., a first optical phase shifter 80-0 may be interposed along optical path 64-0, a second optical phase shifter 80-1 may be interposed along optical path 64-1, an Nth optical phase shifter 80-(N−1) may be interposed along optical path 64-(N−1), etc.). Each optical phase shifter 80 may receive a control signal CTRL that controls the phase S provided to optical local oscillator signal LO1 by that optical phase shifter (e.g., first optical phase shifter 80-0 may impart an optical phase shift of zero degrees/radians to the optical local oscillator signal LO1 provided to antenna 30-0, second optical phase shifter 80-1 may impart an optical phase shift of Δϕ to the optical local oscillator signal LO1 provided to antenna 30-1, Nth optical phase shifter 80-(N−1) may impart an optical phase shift of (N−1)Δϕ to the optical local oscillator signal LO1 provided to antenna 30-(N−1), etc.). By adjusting the phase S imparted by each of the N optical phase shifters 80, control circuitry 14 (FIG. 1) may control each of the antennas 30 in phased antenna array 88 to transmit THF signals 32 and/or to receive THF signals 34 within a formed signal beam 83. Signal beam 83 may be oriented in a particular beam pointing direction (angle) 84 (e.g., the direction of peak gain of signal beam 83). The THF signals conveyed by phased antenna array 88 may have wavefronts 86 that are orthogonal to beam pointing direction 84. Control circuitry 14 may adjust beam pointing direction 84 over time to point towards external communications equipment or an external object or to point away from external objects, as examples.

Phased antenna array 88 may be operable in an active mode in which the array transmits and/or receives THF signals using optical local oscillator signals LO1 and LO2 (e.g., using phase shifts provided to each antenna element to steer signal beam 83). If desired, phased antenna array 88 may also be operable in a passive mode in which the array does not transmit or receive THF signals. Instead, in the passive mode, phased antenna array 88 may be configured to form a passive reflector that reflects THF signals or other electromagnetic waves incident upon device 10. In the passive mode, the UTC PDs 42 in phased antenna array 88 are not illuminated by optical local oscillator signals LO1 and LO2 and transceiver circuitry 26 performs no modulation/demodulation, mixing, filtering, detection, modulation, and/or amplifying of the incident THF signals.

Devices with processing capabilities include clocking circuitry such as phase-locked loops (PLLs) that generate clock signals. Devices with THF signaling capabilities such as device 10 are particularly sensitive to jitter (deviations from perfect periodicity) and phase noise frequency generation in clock signals (e.g., because the clocking circuitry consumes a relatively high amount of power and chip area for THF frequencies). To minimize clock jitter and phase noise, processing operations in device 10 may be clocked using clocking circuitry 75. Examples in which THF communications using transceiver 26 (FIG. 1) are clocked using clocking circuitry 75 are described herein as an example. This is merely illustrative and, in general, clocking circuitry 75 may be used to clock any desired processing operations in device 10 (e.g., high speed digital interface operations, processor computations, sensing, automotive, input/output operations, communications at frequencies lower than 100 GHz such as millimeter/centimeter wave frequencies or frequencies less than 10 GHz, etc.).

Figure 8:
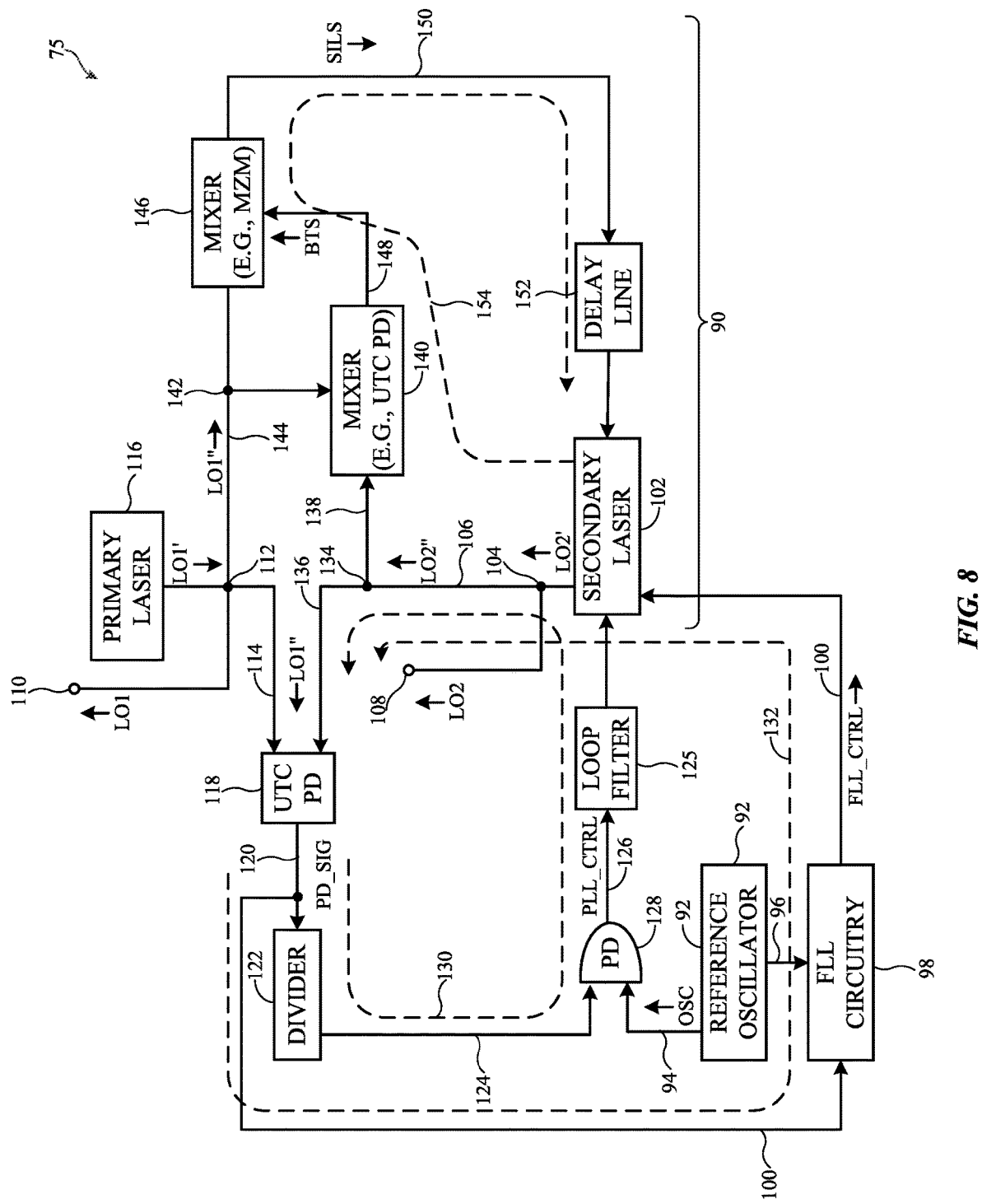
FIG. 8 is a circuit diagram of illustrative clocking circuitry having primary and secondary light sources, a self-injection locking loop, and a phase-locked loop that are used to emit low jitter and low phase noise optical local oscillator signals in accordance with some embodiments.

FIG. 8 is a circuit diagram of clocking circuitry 75. As shown in FIG. 8, clocking circuitry 75 may include an oscillator such as reference oscillator 92, a phase detector (PD) such as phase detector 128, a loop filter such as loop filter 125, a photodiode such photodiode 118, a divider such as divider 122, a first light source such as primary laser 116 (e.g., from LO light sources 70 of FIG. 6), a second light source such as secondary laser 102 (e.g., from LO light sources 70 of FIG. 6), a first mixer such as mixer 140, a second mixer such as mixer 146, and a delay line such as delay line 152 (sometimes referred to herein as delay circuitry 152 or optical delayer 152). If desired, clocking circuitry 75 may optionally include frequency-locked loop (FLL) circuitry such as FLL circuitry 98.

Photodiode 118 may be a UTC PD or another type of photodiode. Divider 122 may be a divider circuit and/or may include sub-sampling circuitry (e.g., a sub-sampling mixer that sub-samples based on an oscillator signal from reference oscillator 92 or another reference oscillator). First mixer 140 may be an optical (e.g., electro-optical) mixer and may include a photodiode such as a UTC PD, for example. First mixer 140 may include a separate UTC PD from UTC PD 118 or, if desired, clocking circuitry 75 may be adapted to use the same UTC PD to perform both the functions of first mixer 140 and UTC PD 118 as described herein (e.g., optical splitters, combiners, couplers, paths, and/or switches may be used to route the optical local oscillator signals as described herein to the shared UTC PD as needed based on whether the functions of UTC PD 118 or the functions of first mixer 140 as described herein are being performed). Second mixer 146 may be an electro-optical mixer (e.g., an electro-optical modulator) such as an MZM, for example.

Reference oscillator 92 may have an output coupled to a first input of phase detector 128 over path 94. The output of reference oscillator 92 may also be coupled to an input of FLL circuitry 98 over path 96 if desired. Phase detector 128 may have a second input coupled to the output of divider 122 over path 124. The output of phase detector 128 may be coupled to a control input of secondary laser 102 over path 126. Path 126 may sometimes be referred to herein as a control path or a phase-locked loop (PLL) control path for secondary laser 102.

Loop filter 125 may be interposed on path 124 between phase detector 128 and secondary laser 102. The input of divider 122 may be coupled to the output of UTC PD 118 over path 120. If desired, path 120 and the output of UTC PD 118 may also be coupled to a control input of secondary laser 102 over path 100. Path 100 may sometimes be referred to herein as a control path or a frequency-locked loop (FLL) control path for secondary laser 102. FLL circuitry 98 may be interposed on path 100 between UTC PD 118 and secondary laser 102. FLL circuitry 98 may include a counter, filter circuitry, or other circuitry involved in performing an FLL around secondary laser 102.

Secondary laser 102 may have an output coupled to optical node 104. Optical node 104 may couple the output of secondary laser 102 to optical node 134 over optical path 106 and to output terminal 108 of clocking circuitry 75. Optical node 134 may couple optical path 106 to a first input of UTC PD 118 over optical path 136 and to a first input of first mixer 140 over optical path 138 (e.g., the first input of first mixer 140 and the first input of UTC PD 118 may be optically coupled to secondary laser 102). Optical node 104 and optical node 134 may each include one or more optical splitters, optical combiners, optical switches, optical lenses, optical waveguides, optical fibers, optical prisms, optical beam splitters, and/or optical couplers. If desired, optical nodes 104 and 134 may include one or more of the same (shared) optical splitters, optical combiners, optical switches, optical lenses, optical prisms, optical beam splitters, optical fibers, optical waveguides, and/or optical couplers (e.g., optical path 106 may be omitted and optical node 104 may also form optical node 134, such that one or more of the same optical splitters, optical combiners, optical fibers, optical waveguides, optical switches, optical lenses, optical prisms, optical beam splitters, and/or optical couplers couples the output of secondary laser 102 to output terminal 108, the first input of UTC PD 118, and the first input of first mixer 140).

Primary laser 116 may have an output coupled to optical node 112. Optical node 112 may couple the output of primary laser 116 to output terminal 110 of clocking circuitry 75, a second input of UTC PD 118 over optical path 114, and optical node 142 over optical path 144 (e.g., the second input of UTC PD 118 may be optically coupled to primary laser 116). Optical node 142 may couple optical path 144 to a second input of first mixer 140 and to a first input of second mixer 146 (e.g., the second input of first mixer 140 may be optically coupled to primary laser 116 and the first input of second mixer 146 may be optically coupled to primary laser 116). Optical node 112 and optical node 142 may each include one or more optical splitters, optical combiners, optical switches, optical fibers, optical waveguides, optical lenses, optical prisms, optical beam splitters, and/or optical couplers. If desired, optical nodes 112 and 142 may include one or more of the same (shared) optical splitters, optical combiners, optical switches, optical lenses, optical prisms, optical fibers, optical waveguides, optical beam splitters, and/or optical couplers (e.g., optical path 144 may be omitted and optical node 112 may also form optical node 142, such that one or more of the same optical splitters, optical combiners, optical switches, optical lenses, optical prisms, optical fibers, optical waveguides, optical beam splitters, and/or optical couplers couples the output of primary laser 116 to output terminal 110, the second input of UTC PD 118, the second input of first mixer 140, and the first input of second mixer 146).

First mixer 140 may have an output (communicably) coupled to a second input of second mixer 146 over path 148. Second mixer 146 may have an output coupled to an input of delay line 152 over optical path 150. Optical path 150 may sometimes be referred to herein as a control path or a self-injection locking control path. Delay line 152 may have an output coupled to a control input of secondary laser 102 (e.g., the output of second mixer 146 may be optically or communicably coupled to the control input secondary laser 102 via optical path 150 and delay line 152). Delay line 152 may include one or more optical delay elements configured to introduce a delay to the signals on optical path 150. Delay line 152 may also generate an error signal if desired. The optical paths in clocking circuitry 75 (e.g., optical paths 106, 138, 136, 114, 144, 148, and 150) may include optical fibers and/or optical waveguides. Paths 120, 100, 124, 98, 124, 96, and 148 may include conductive paths (e.g., radio-frequency transmission line structures or other paths) that convey current rather than optical signals.

Output terminals 108 and 110 may provide optical LO signals that are used to clock other components in device 10. In implementations where clocking circuitry 75 is used to clock THF communications using transceiver 26 (FIG. 1), terminal 108 may be coupled to optical path 62 and terminal 110 may be coupled to optical path 64 of FIG. 6, for example. Clocking circuitry 75 may include multiple control/feedback loops that are used to minimize phase noise and jitter in the optical LO signals provided to output terminals 108 and 110. As shown in FIG. 8, clocking circuitry 75 may include at least a PLL (e.g., an OPLL) around secondary laser 102 and a self-injection locking loop around secondary laser 102.

For example, UTC PD 118, path 120, divider 122, path 124, phase detector 128, path 126, loop filter 125, secondary laser 102, optical path 106, and optical path 136 may form a PLL as shown by PLL path 130. On the other hand, secondary laser 102, optical path 106, optical path 138, first mixer 140, path 148, second mixer 146, optical path 150, and delay line 152 may form a self-injection locking loop as shown by self-injection locking loop path 154. Primary laser 116, secondary laser 102, first mixer 140, second mixer 146, path 148, optical path 150, delay line 152, optical node 104, optical node 134, optical node 112, optical node 142, and optical paths 144, 138, and 106 may collectively form self-injection locking loop circuitry 90. If desired, clocking circuitry 75 may also include an optional frequency-locked loop (FLL) around secondary laser 102 and the PLL (e.g., the PLL may be nested within the FLL). For example, UTC PD 118, path 120, path 100, FLL circuitry 98, secondary laser 102, optical path 106, and optical path 136 may form an FLL as shown by FLL path 132.

Primary laser 116 may generate optical local oscillator signal LO1 on output terminal 110. Secondary laser 102 may generate optical local oscillator signal LO2 on output terminal 108. During generation of optical LO signals LO1 and LO2, clocking circuitry 75 may use the PLL, the self-injection locking loop (sometimes referred to herein as a self-injection locked loop), and optionally the FLL to actively adjust secondary laser 102 to minimize phase noise and jitter. For example, FLL path 132, PLL path 130, and self-injection locking loop path 154 may each be feedback paths for secondary laser 102 (e.g., feedback paths that communicably couple the output of secondary laser 102 to the (control) input(s) of secondary laser 102. The FLL may be used to coarsely adjust (tune) secondary laser 102 until secondary laser 102 is frequency locked with primary laser 116 (e.g., until optical local oscillator signal LO1 is frequency locked with optical local oscillator signal LO2 such that there is a selected/predetermined stable frequency difference between the two optical local oscillators). The PLL may be used to less-coarsely adjust (tune) secondary laser 102 until secondary laser 102 is phase locked with primary laser 116 (e.g., until optical local oscillator signal LO1 is phase locked with optical local oscillator signal LO2). The self-injection locking loop may be used to fine tune secondary laser 102 to further reduce the phase noise and jitter of secondary laser 102, thereby optimizing the processing operations performed by device 10 using optical local oscillator signals LO1 and LO2.

While described herein as lasers, primary laser 116 and secondary laser 102 may be any desired light sources/emitters. Lasers 116 and 102 may form LO light sources 70 of FIG. 7 and/or may respectively form LO light sources 70A and 70B of FIG. 7, for example. Primary laser 116 may sometimes also be referred to as a leader laser whereas secondary laser 102 is sometimes also referred to as a follower laser. Primary laser 116 may emit optical local oscillator signal LO1' at a fixed frequency/wavelength (e.g., primary laser 116 may be a fixed (non-adjustable) laser having a fixed frequency). On the other hand, secondary laser 102 may emit optical local oscillator signal LO2' at an adjustable/programmable frequency/wavelength (e.g., secondary laser 102 may be an adjustable/programmable laser). Control signals received by secondary laser 102 over paths 126, 100, and 150 may be used to adjust/program the frequency and/or phase of optical local oscillator signal LO2'. The wavelength of optical local oscillator signal LO2' may be offset from the wavelength of optical local oscillator signal LO1' by a selected wavelength offset X (e.g., the frequencies of the THF signals to be transmitted and/or received using optical local oscillator signals LO1 and LO2).

Optical node 104 may transmit a first amount of power from optical local oscillator signal LO2' to UTC PD 118 and/or first mixer 140 as optical local oscillator signal LO2". Optical node 104 may transmit a second amount of power from optical local oscillator signal LO2' to output terminal 108 as optical local oscillator signal LO2 (e.g., where the second amount of power is greater than the first amount). As an example, optical node 104 may provide 10% of the power of optical local oscillator signal LO2' to UTC PD 118 or first mixer 140 as optical local oscillator signal LO2" and may provide 90% of the power of optical local oscillator signal LO2' to output terminal 108 as optical local oscillator signal LO2.

At the same time, optical node 112 may transmit a first amount of power from optical local oscillator signal LO1' to UTC PD 118 over optical path 114 and/or to mixers 140 and 146 as optical local oscillator signal LO1". Optical node 112 may transmit a second amount of power from optical local oscillator signal LO1' to output terminal 110 as optical local oscillator signal LO1 (e.g., where the second amount of power is greater than the first amount). As an example, optical node 112 may provide 10% of the power of optical local oscillator signal LO1' to UTC PD 118 or to mixers 140 and 146 as optical local oscillator signal LO1" and may provide 90% of the power of optical local oscillator signal LO1' to output terminal 110 as optical local oscillator signal LO1. Optical local oscillator signals LO2" and LO1" may be processed by the FLL, the PLL, and the self-injection locking loop in clocking circuitry 75 to frequency lock and phase lock optical local oscillator signals LO1 and LO2 while minimizing the phase noise and jitter of optical local oscillator signal LO2.

During tuning of secondary laser 102 using FLL path 132 and PLL path 130, UTC PD 118 may generate and output photodiode signal PD_SIG on path 120 based on the optical local oscillator signals LO2" and LO1" received over optical paths 136 and 114. Photodiode signal PD_SIG may be at a frequency given by the difference between the frequency of optical local oscillator signal LO2" and the frequency of optical local oscillator signal LO1" (e.g., the frequency of THF signals 32/34 of FIG. 6). Path 120 may convey photodiode signal PD_SIG to divider 122 when the PLL tunes secondary laser 102 and may convey photodiode signal PD_SIG to FLL circuitry 98 via path 100 when the FLL tunes secondary laser 102.

During tuning of secondary laser 102 using FLL path 132 and PLL path 130, reference oscillator 92 may generate reference oscillator signal OSC. Reference oscillator 92 may, for example, be a microelectromechanical systems (MEMS) oscillator, a crystal oscillator, or any other fixed or slightly tunable stable oscillator. Reference oscillator signal OSC may be produced at a fixed radio frequency such as a frequency between around 5-25 GHz. Reference oscillator 92 may provide reference oscillator signal OSC to phase detector 128 over path 94 and to FLL circuitry 98 over path 96 (e.g., to a counter in FLL circuitry 98). If desired, reference oscillator 92 may include a digital-to-time converter (DTC) that generates a modified reference oscillator signal based on reference oscillator signal OSC and may provide the modified reference oscillator signal to phase detector 128 and/or to divider 122 (e.g., a sub-sampling mixer) during tuning of secondary laser 102 by the PLL. Phase detector 128 may produce an output signal PLL_CTRL (e.g., a tuning control signal) that is provided to the control input of secondary laser 102 via loop filter 125. During tuning of secondary laser 102 by the FLL, FLL circuitry 98 may produce an output signal FLL_CTRL (e.g., a tuning control signal) that is provided to the control input of secondary laser 102.

During reduction of the phase noise of secondary laser 102 using self-injection locking loop circuitry 90, optical local oscillator signal LO2" may be provided to the first input of first mixer 140 and optical local oscillator signal LO1" may be provided to the second input of first mixer 140 and to the first input of second mixer 146. First mixer 140 may output beat signal BTS on path 148. Second mixer 146 may produce self-injection locking signal SILS on optical path 150 based on optical local oscillator signal LO1" and beat signal BTS (e.g., by modulating optical local oscillator signal LO1" with beat signal BTS). Delay line 152 may use self-injection locking signal SILS to self-injection lock secondary laser 102. Delay line 152 may include long spools of optical fibers and/or other optical delay components. Delay line 152 may introduce delay to the photons of self-injection locking signal SILS that serves to filter out phase noise from self-injection locking signal SILS.

Figure 9:
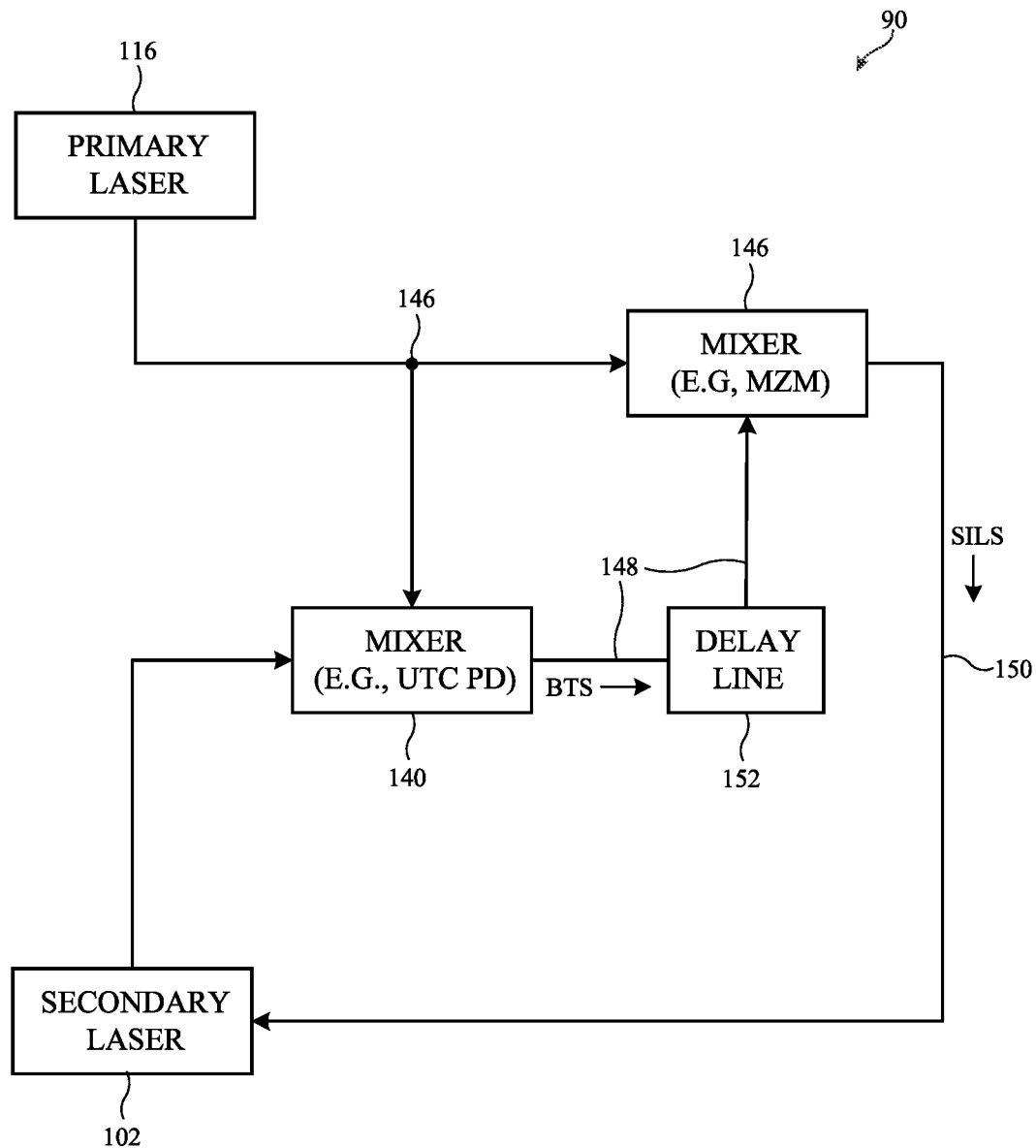
FIG. 9 is a circuit diagram of illustrative self-injection locking circuitry that includes a delay line that operates on a beat signal in accordance with some embodiments.

The example of FIG. 8 is merely illustrative. Path 100 and FLL circuitry 98 may be omitted. UTC PD 118 and/or first mixer 140 need not include UTC PD(s) and may, in general, be an adjustable/programmable photodiode or component that converts electromagnetic energy (e.g., light or light energy) at optical frequencies (e.g., ultraviolet frequencies, visible frequencies, and/or infrared frequencies) to current at THF frequencies (e.g., the same type of component used to produce current on antenna radiating element arms 36 using optical local oscillator signals LO1 and LO2 of FIG. 6). If desired, delay line 152 may be interposed on path 148 instead of on optical path 150 between second mixer 146 and secondary laser 102. FIG. 9 is a diagram of self-injection locking loop circuitry 90 in an example where delay line 152 may be interposed on path 148. The PLL and FLL of clocking circuitry 75 are not shown in FIG. 9 for the sake of simplicity.

As shown in FIG. 9, delay line 152 may be interposed on path 148 between the output of first mixer 140 and the second input of mixer 146 (e.g., the output of first mixer 140 may be communicably coupled to the second input of second mixer 146 via delay line 152). Optical path 150 may be coupled to the control input of secondary laser 102 without a delay line. First mixer 140 may output beat signals BTS on path 148. Delay line 152 may delay beat signals BTS (e.g., in the electrical domain) to de-correlate optical phase noise from the output of secondary laser 102, which may allow phase noise reduction by self-injection at secondary laser 102.

Figure 10:
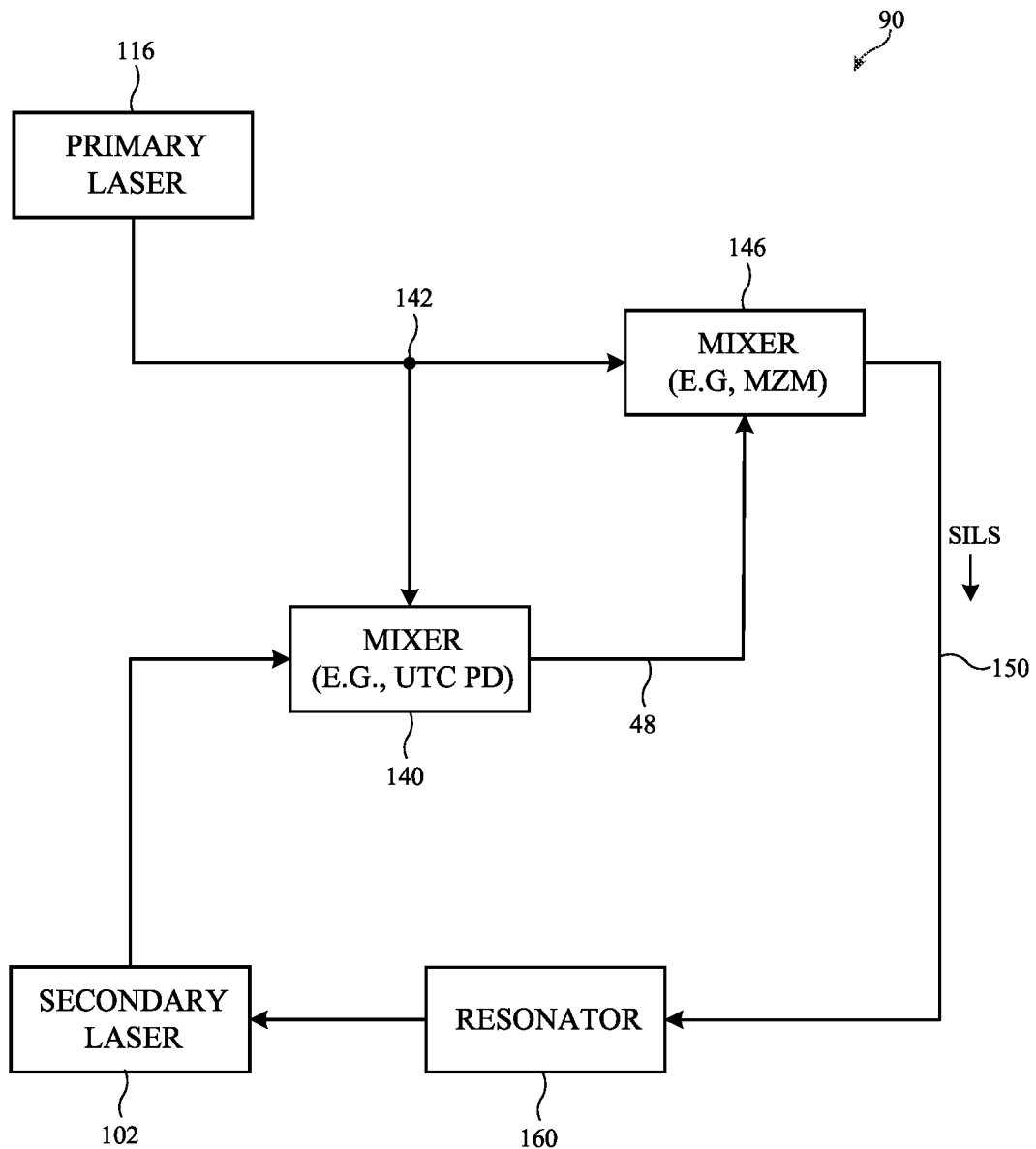
FIG. 10 is a circuit diagram of illustrative self-injection locking circuitry that includes a resonator that performs self-injection locking on a secondary light source in accordance with some embodiments.

In other implementations, delay line 152 may be replaced with an optical resonator interposed on optical path 150. FIG. 10 is a diagram of self-injection locking loop circuitry 90 in an example where delay line 152 of FIG. 8 has been replaced with an optical resonator. The PLL and FLL of clocking circuitry 75 are not shown in FIG. 10 for the sake of simplicity. As shown in FIG. 10, an optical resonator such as resonator 160 may be interposed on optical path 150 between the output of second mixer 146 and the control input of secondary laser 102. Resonator 160 may be a high-Q optical resonator. Resonator 160 may have an optical resonance that causes photons from self-injection locking signal SILS to remain in resonance inside the resonator. The longer the photons remain circulating within the resonator, the more phase noise can be eliminated from self-injection locking signal SILS. The example of FIG. 10 is merely illustrative and, if desired, resonator 160 may be coupled between first mixer 140 and second mixer 146 (e.g., delay line 152 of FIG. 9 may be replaced with resonator 160).

The examples of FIG. 8-10 are merely illustrative. If desired, secondary laser 102 and primary laser 116 may share the same resonating cavity (e.g., secondary laser 102 may utilize a longer or shorter portion of the resonating cavity than primary laser 116 to allow for the difference in wavelength between the optical local oscillator signals). Sharing a common resonating cavity between secondary laser 102 and primary laser 116 may cause secondary laser 102 and primary laser 116 to exhibit very similar thermal effects, thereby helping to tightly lock secondary laser 102 to primary laser 116. The components of clocking circuitry 75 may be implemented in hardware (e.g., one or more digital logic gates, digital circuits, analog circuits, one or more processors, etc.) and/or software (e.g., using logical/computational operations executed by one or more processors).

Figure 11:
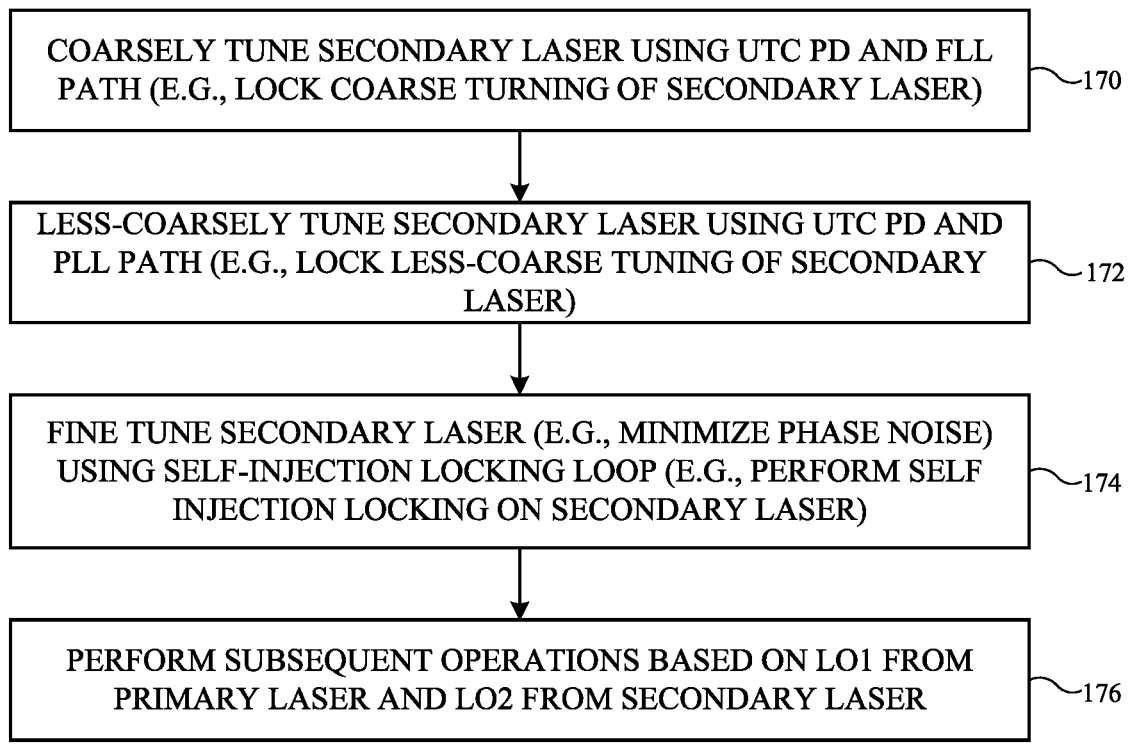
FIG. 11 is a flow chart of illustrative operations involved in using clocking circuitry to emit low jitter and low phase noise optical local oscillator signals using at least a phase-locked loop and self-injection locking in accordance with some embodiments.

FIG. 11 is a flow chart of illustrative operations involved in using clocking circuitry 75 to generate optical local oscillator signals LO1 and LO2 (e.g., to clock one or more components in device 10 such as wireless circuitry 24 of FIG. 1).

At optional operation 170, clocking circuitry 75 may coarsely tune secondary laser 102 using FLL path 132 (FIG. 8). For example, primary laser 116 and secondary laser 102 may begin to illuminate UTC PD 118 using optical local oscillator signals LO2" and LO1". UTC PD 118 may generate photodiode signal PD_SIG based on optical local oscillator signals LO2" and LO1". Path 100 may convey photodiode signal PD_SIG to FLL circuitry 98. Reference oscillator 92 may begin to generate reference oscillator signal OSC and may provide reference oscillator signal OSC (or a modified reference oscillator signal) to FLL circuitry 98 (e.g., to a counter in FLL circuitry 98). FLL circuitry 98 (e.g., the counter) may identify the frequency of photodiode signal PD_SIG using reference oscillator signal OSC as a reference.

Logic in FLL circuitry 98 (e.g., a comparator and/or other digital logic) may compare the identified frequency to the predetermined/expected/selected frequency of secondary laser 102. If the identified frequency is excessively far from the expected frequency (e.g., if the difference between the identified frequency and the expected frequency exceeds a threshold), FLL circuitry 98 may use output signal FLL_CTRL to coarsely adjust the frequency of secondary laser 102 until the identified frequency is sufficiently close to the expected frequency. Output signal FLL_CTRL may coarsely tune the frequency of secondary laser 102 using input current adjustments, piezoelectric adjustments, mirror shifts, etc. When the identified frequency is sufficiently close to the expected frequency (e.g., when the difference between the identified frequency and the expected frequency is less than the threshold), clocking circuitry 75 may lock the coarse tuning of secondary laser 102 (e.g., may frequency lock secondary laser 102 and optical local oscillator signal LO2'). Processing may subsequently proceed to operation 160 via path 172. If desired, operation 170 may be omitted.

At operation 172, clocking circuitry 75 may less-coarsely tune secondary laser 102 using PLL path 130 (FIG. 8) until the phase of photodiode signal SIG_PD is sufficiently close to a predetermined or expected phase. When the phase is sufficiently close to the expected phase, clocking circuitry 75 may lock the less-coarse tuning of secondary laser 102 (e.g., may phase lock secondary laser 102 and optical local oscillator signal LO2' to the phase of optical local oscillator signal LO1').

At operation 174, clocking circuitry 75 may further reduce the phase noise of secondary laser 102 (e.g., sometimes referred to herein as fine-tuning secondary laser 102) using self-injection locking loop circuitry 90 (FIG. 8). This may involve the self-injection or feedback of self-injection locking signal SILS into/onto secondary laser 102. In other words, clocking circuitry 75 may use self-injection locking loop path 154 to self-injection lock secondary laser 102, thereby reducing phase noise.

At operation 176, clocking circuitry 75 may clock one or more processing operations in device 10 using optical local oscillator signals LO1 and LO2 (e.g., device 10 may perform subsequent processing operations as clocked by optical local oscillator signals LO1 and LO2). For example, the UTC PDs 42 in device 10 may transmit and/or receive THF signals using the optical local oscillator signals LO1 and LO2 produced by clocking circuitry 75 with minimal phase noise and jitter.

Figure 12:
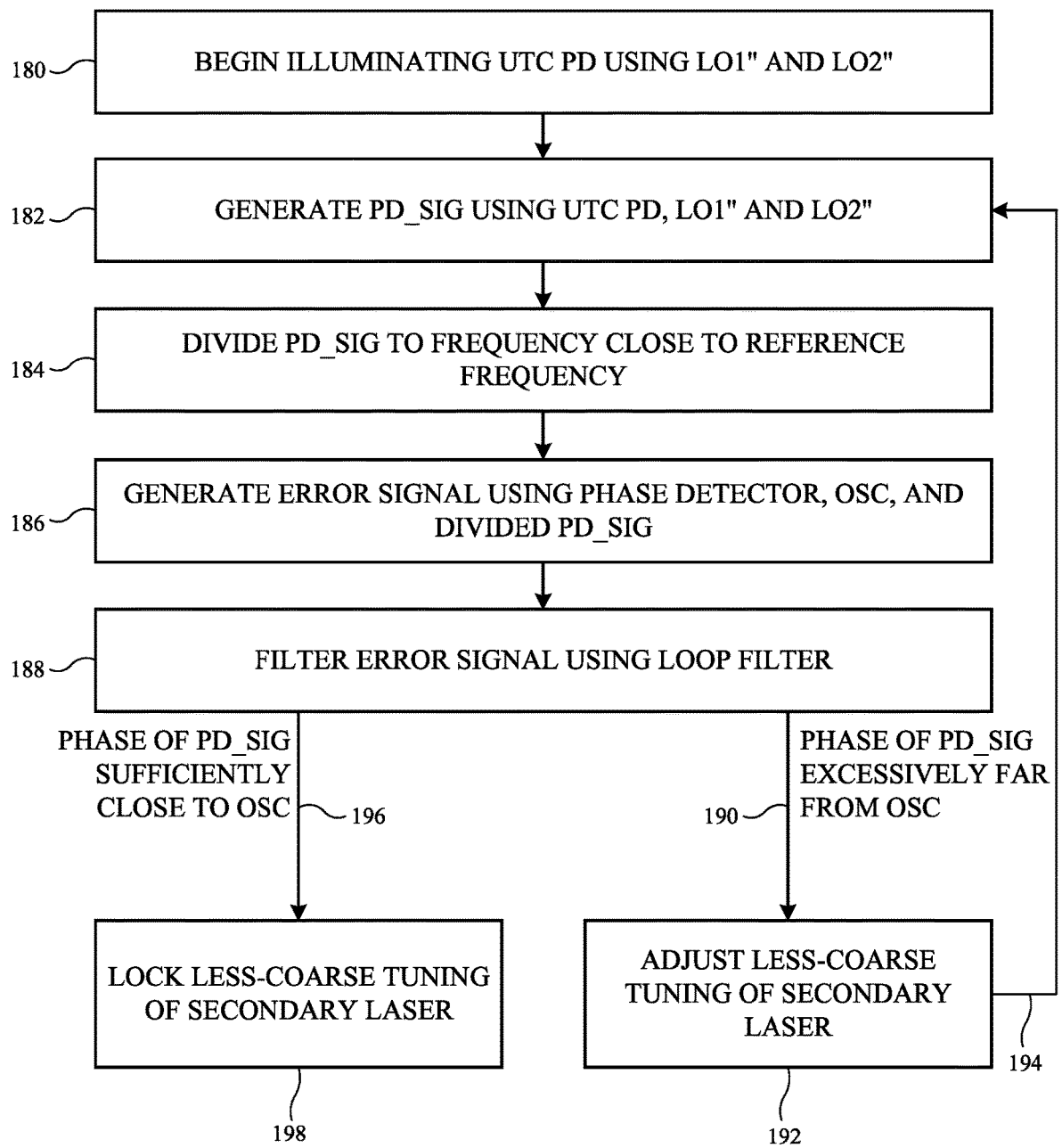
FIG. 12 is a flow chart of illustrative operations involved in using a phase-locked loop in clocking circuitry to coarsely tune a secondary light source in accordance with some embodiments.

FIG. 12 is a flow chart of illustrative operations that may be performed by clocking circuitry 75 to tune secondary laser 102 using PLL path 130 of FIG. 8. The operations of FIG. 12 may, for example, be performed while processing operation 172 of FIG. 11.

At operation 180, primary laser 116 and secondary laser 102 may begin to illuminate UTC PD 118 using optical local oscillator signals LO2" and LO1".

At operation 182, UTC PD 118 may generate photodiode signal PD_SIG based on optical local oscillator signals LO2" and LO1". The frequency of photodiode signal PD_SIG may be given by the difference between the frequencies of optical local oscillator signals LO2" and LO1" (e.g., a frequency corresponding to wavelength offset X). Path 120 may convey photodiode signal PD_SIG to divider 122.

At operation 184, divider 122 may divide or subsample photodiode signal PD_SIG to a frequency close to a reference frequency. The reference frequency may be the frequency of reference oscillator signal OSC, for example. If desired, divider 122 may be a subsampling mixer that processes photodiode signal PD_SIG based on a modified reference oscillator signal produced by a DTC in reference oscillator 92. Divider 122 may provide the divided (e.g., sub-sampled) photodiode signal PD_SIG to phase detector 128 over path 124.

At operation 186, phase detector 128 may compare the phase of the divided photodiode signal PD_SIG on path 124 to the phase of reference oscillator signal OSC (or the phase of the modified reference oscillator signal produced by a DTC in reference oscillator 92). Phase detector 128 may include digital XOR logic and/or a phase detector and comparator sometimes referred to herein collectively as a phase comparator. In practice, photodiode signal PD_SIG may be at much higher frequencies (e.g., 50-400 GHz) than reference oscillator signal OSC (e.g., 5-25 GHz), making phase comparison difficult or impossible. As such, subsampling the photodiode signal using divider 122 may more easily allow such a phase comparison (e.g., where the phase of the subsampled photodiode signal is similar to the phase of the original photodiode signal). Divider 122 may subsample photodiode signal PD_SIG by only comparing a regularly spaced subset of the samples in photodiode signal PD_SIG to reference oscillator signal OSC, for example (e.g., every eighth sample of photodiode signal PD_SIG).

Phase detector 128 may include comparison logic that compares the difference between the measured phase of photodiode signal PD_SIG (e.g., the subsampled photodiode signal) and generates a corresponding error signal such as output signal PLL_CTRL. Output signal PLL_CTRL may be, for example, an error signal indicative of the phase error in the optical local oscillator produced by secondary laser 102. At operation 188, loop filter 125 may filter the error signal (e.g., using a 1-3 MHz filter).

Comparison logic on PLL path 130 (e.g., in phase detector 128, loop filter 125, etc.) may compare the difference between the phase of the divided photodiode signal PD_SIG and the phase of reference oscillator signal OSC to a predetermined threshold value. If the phase of photodiode signal PD_SIG is excessively far from the phase of reference oscillator signal OSC (e.g., if the difference exceeds a threshold), processing may proceed to operation 192 via path 190. At operation 192, PLL path 130 may use output signal PLL_CTRL to less-coarsely adjust secondary laser 102 to begin outputting optical local oscillator signals LO2' at a different phase. Output signal PLL_CTRL may less-coarsely tune the phase of secondary laser 102 by adjusting the input current of a phase shift section in secondary laser 102, for example.

Processing may loop back to operation 182 via path 194 and phase detector 128 may continue re-measuring photodiode signal PD_SIG and finely adjusting secondary laser 102 until the phase of photodiode signal PD_SIG (e.g., the subsampled photodiode signal) is sufficiently close to the phase of reference oscillator signal OSC (e.g., until the difference is less than a threshold), at which point processing may proceed to operation 198 via path 196. At operation 198, clocking circuitry 75 may lock (freeze) the phase of secondary laser 102 in place (e.g., may lock the less-coarse tuning of secondary laser). The optical local oscillator signals LO1 and LO2 subsequently generated by primary laser 116 and secondary laser 102 may thereafter be frequency locked and phase locked. To further reduce phase noise, self-injection locking loop circuitry 90 may then perform self-injection locking on secondary laser 102.

Figure 13:
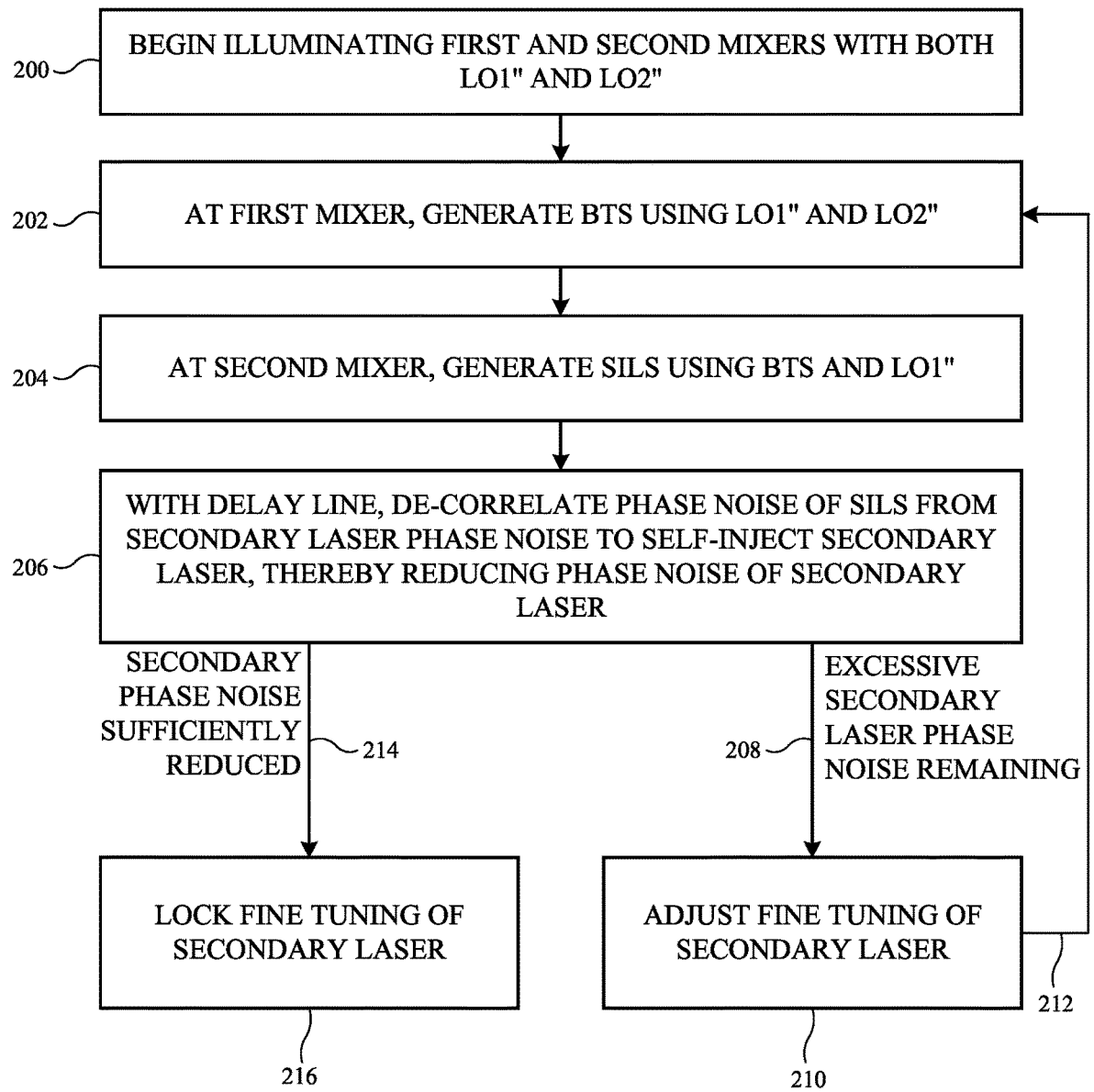
FIG. 13 is a flow chart of illustrative operations involved in using self-injection locking circuitry in clocking circuitry to finely tune a secondary light source in accordance with some embodiments.

FIG. 13 is a flow chart of illustrative operations that may be performed by clocking circuitry 75 to fine tune secondary laser 102 using self-injection locking loop path 154 of FIG. 8. The operations of FIG. 13 may, for example, be performed while processing operation 174 of FIG. 11.

At operation 200, clocking circuitry 75 may begin to illuminate the first input of first mixer 140 with optical local oscillator signal LO2" and may begin to illuminate the second input of first mixer 140 and the first input of second mixer 146 with optical local oscillator signal LO1".

At operation 202, first mixer 140 (e.g., a UTC PD or other photodiode) may generate beat signal BTS using (based on) first optical local oscillator signal LO1" and second optical local oscillator signal LO2". Beat signal BTS may have a frequency given by the difference between the frequency of optical local oscillator signal LO1" and the frequency of optical local oscillator signal LO2" (e.g., a frequency corresponding to wavelength offset X such as the frequency of THF signals 32/34).

At operation 204, second mixer 146 (e.g., an MZM or another electro-optical mixer or modulator) may generate self-injection locking signal SILS on optical path 150 using (based on) first optical local oscillator signal LO1" and beat signal BTS (e.g., by mixing or modulating beat signal BTS onto first optical local oscillator signal LO1"). Modulation by second mixer 146 may generate two sideband signals of a carrier formed by first optical local oscillator signal LO1". If desired, second mixer 146 may filter out one of the sideband signals, leaving self-injection locking signal SILS at a frequency equal to the frequency of the optical local oscillator signal produced by second laser 102 (e.g., optical local oscillator signal LO2").

At operation 206, delay line 152 may self-inject secondary laser 102 using self-injection locking signal SILS. Delay line 152 may, for example, optically delay self-injection locking signal SILS to de-correlate the phase noise of secondary laser 102 and then inject self-injection locking signal SILS into secondary laser 102, which allows secondary laser 102 to reduce its phase noise via self-injection locking. Secondary laser 102 may, for example, include a laser cavity between two mirrors that keep photons within the laser cavity. When self-injection is performed, the self-injection locking signal SILS (e.g., an optical signal at the same frequency as optical local oscillator signal LO2') is transmitted into the laser cavity from path 150 through the mirror. The self-injected photons from self-injection locking signal SILS have been cleaned (de-correlated) of phase noise by delay line 152 and may help secondary laser 102 to output optical local oscillator signal LO2' (and thus the corresponding optical local oscillator signals LO2" and LO2) with reduced phase noise. Iterating over this process one or more times fine-tunes and self-injection locks secondary laser 102. Self-injection locking signal SILS may sometimes be referred to herein as a self-injection locking input signal after being delayed by delay line 152.

This example is merely illustrative. In implementations where delay line 152 is replaced with a resonator such as resonator 160 in FIG. 10, resonator 160 may filter phase noise of self-injection locking signal SILS prior to feeding back to secondary laser 102. For example, resonator 160 may allow the photons in self-injection locking signal SILS to resonate and remain within resonator 160. The longer the photons resonate and remain within resonator 160, the more phase noise is cleaned from the photons. Resonator 160 may allow phase noise cleaning without requiring long spools of optical fiber or other bulky components used to form delay line 152. In implementations where delay line 152 is disposed on path 148 of FIG. 8 (e.g., as shown in FIG. 9), delay line 152 may clean the phase noise from beat signal BTS rather than self-injection locking signal SILS. If there is still excessive phase noise in secondary laser 102, processing may proceed to operation 210 via path 208, the fine tuning of secondary laser 102 may be adjusted (e.g., by continuing to iteratively self-inject secondary laser 102 by looping processing back to operation 202 until phase noise has been sufficiently reduced). Once phase noise has been sufficiently reduced for secondary laser 102, processing may proceed to operation 216 via path 216 and clocking circuitry 75 may lock the fine tuning of secondary laser 102.

Clocking circuitry 75 may then generate optical local oscillator signals LO1 and LO2 for clocking other components in device 10 (e.g., to control UTC PDs 42 in wireless circuitry 24 of FIGS. 6 and 7 to transmit and/or receive THF signals) with minimal jitter and minimal phase noise. Generating optical local oscillator signals LO1 and LO2 in this way may allow frequency tuning of 0.2% of one laser working for example, at a frequency of 200,300 GHz, which may be sufficient to cover any wanted frequency for THF signals 32/34 from about 50 GHz to about 400 GHz. At the same time, the power efficiency of the laser light sources in clocking circuitry 75 may be greater than 30%, which is higher than in millimeter wave communications and in voltage controlled oscillators (VCOs) that operate at sub-THz frequencies, which typically have a power efficiency on the order of a few percent. Furthermore, to prevent crosstalk between the generated sub-THz signal and the antennas and power amplifiers operating at sub-THz frequencies, clocking circuitry 74 may clock wireless circuitry 24 without requiring lossy inductive coils.

Device 10 may gather and/or use personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users. The optical components described herein (e.g., MZM modulator(s), waveguide(s), phase shifter(s), UTC PD(s), etc.) may be implemented in plasmonics technology if desired.

The methods and operations described above in connection with FIGS. 1-13 (e.g., the operations of FIGS. 11-13) may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry 18 of FIG. 1, etc.). The processing circuitry may include microprocessors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. Clocking circuitry comprising:
   a first light source configured to generate a first optical signal at a first frequency;
   a second light source configured to generate a second optical signal at a second frequency different from the first frequency;
   a first mixer having a first input optically coupled to the first light source and having a second input optically coupled to the second light source; and
   a second mixer having a first input optically coupled to the first light source, a second input communicatively coupled to an output of the first mixer, and an output optically coupled to the second light source.

2. The clocking circuitry of claim 1, wherein the first mixer is configured to generate a beat signal based on the first optical signal and the second optical signal.

3. The clocking circuitry of claim 2, wherein the second mixer is configured to generate a self-injection locking signal based on the beat signal and the first optical signal.

4. The clocking circuitry of claim 3, further comprising:
   a delay line having an input coupled to the output of the second mixer and having an output coupled to the second light source, wherein the delay line is configured to self-inject the self-injection locking signal onto the second light source.

5. The clocking circuitry of claim 3, further comprising:
   an optical path that couples the output of the second mixer to the second light source; and
   an optical resonator disposed on the optical path, wherein the optical resonator is configured to self-inject the self-injection locking signal onto the second light source.

6. The clocking circuitry of claim 1, further comprising:
   a path that couples the output of the first mixer to the second input of the second mixer; and
   a delay line disposed on the path.

7. The clocking circuitry of claim 1, wherein the first light source comprises a first laser and the second light source comprises a second laser.

8. The clocking circuitry of claim 1, wherein the first mixer comprises a photodiode and the second mixer comprises an electro-optical modulator.

9. The clocking circuitry of claim 1, wherein the second mixer comprises a Mach-Zehnder modulator (MZM).

10. The clocking circuitry of claim 1, wherein the first mixer comprises a uni-travelling-carrier photodiode (UTC PD).

11. The clocking circuitry of claim 1, further comprising:
    a photodiode having a first input optically coupled to the first light source and a second input optically coupled to the second light source.

12. The clocking circuitry of claim 11, further comprising a phase-locked loop (PLL) path that includes:
    the photodiode;
    a divider coupled to an output of the photodiode;
    a phase detector having a first input coupled to an output of the divider and a second input that receives a reference oscillator signal; and
    a loop filter coupled between an output of the phase detector and the second light source.

13. Clocking circuitry comprising:
    a first laser configured to generate a first optical local oscillator (LO) signal;
    a second laser configured to generate a second optical LO signal;
    a phase-locked loop (PLL) path coupled around the second laser and configured to lock a phase of the second optical LO signal to a phase of the first optical LO signal; and
    a self-injection locking loop path coupled around the second laser and configured to self-injection lock the second laser.

14. The clocking circuitry of claim 13, wherein the self-injection locking loop path comprises:
    a delay line or an optical resonator configured to self-inject a signal from the self-injection locking loop path onto the second laser.

15. The clocking circuitry of claim 14, wherein the self-injection locking loop path comprises:
    a photodiode configured to mix the first optical LO signal with the second optical LO signal to generate a beat signal; and
    an electro-optical modulator configured to generate the signal on the self-injection locking loop path by modulating the first optical LO signal with the beat signal.

16. The clocking circuitry of claim 13 wherein the PLL loop path comprises:
    a uni-travelling-carrier photodiode (UTC PD) having a first input that receives the first optical LO signal and a second input that receives the second optical LO signal;
    a sub-sampling mixer having an input coupled to an output of the UTC PD;
    a phase detector having an input coupled to an output of the sub-sampling mixer; and
    a loop filter coupled between an output of the phase detector and the second laser.

17. The clocking circuitry of claim 13, further comprising:
    a frequency-locked loop (FLL) path coupled around the PLL path and configured to lock a frequency of the second optical LO signal to a frequency of the first optical LO signal.

18. A method of operating wireless circuitry to transmit wireless signals, the method comprising:
    emitting, at a first laser, a first optical local oscillator (LO) signal at a first frequency;
    emitting, at a second laser, a second optical LO signal at a second frequency that is different from the first frequency;
    producing, at a first photodiode illuminated by the first optical LO signal and the second optical LO signal, an antenna current on an antenna resonating element, the antenna current having a third frequency given by a difference between the first frequency and the second frequency;
    generating, at a second photodiode, a beat signal based on the first optical LO signal and the second optical LO signal, the beat signal having the third frequency;
    generating, at a mixer, a self-injection locking signal based on the beat signal and the first optical LO signal; and self-injection locking the second laser based on the self-injection locking signal.

19. The method of claim 18, further comprising:
phase locking, using a phase-locked loop (PLL) path, the first optical LO signal to the second optical LO signal.

20. The method of claim 19, wherein phase locking the first optical LO signal to the second optical LO signal comprises:
generating, at a third photodiode, a photodiode signal based on the first optical LO signal and the second optical LO signal, the photodiode signal having the third frequency;
generating, at a phase detector, an error signal based on the photodiode signal and a reference oscillator signal; and
tuning the second laser based on the error signal.

* * * * *